United States Patent
Yoon et al.

(10) Patent No.: US 7,384,841 B2
(45) Date of Patent: Jun. 10, 2008

(54) DRAM DEVICE AND METHOD OF MANUFACTURING THE SAME

(75) Inventors: Hong-Sik Yoon, Seongnam-si (KR); In-Seok Yeo, Seoul (KR); Seung-Jae Baik, Seoul (KR); Zong-Liang Huo, Suwon-si (KR); Shi-Eun Kim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 159 days.

(21) Appl. No.: 11/358,060

(22) Filed: Feb. 22, 2006

(65) Prior Publication Data

US 2006/0197131 A1 Sep. 7, 2006

(30) Foreign Application Priority Data

Mar. 5, 2005 (KR) ............. 10-2005-0018405

(51) Int. Cl.
*H01L 21/8234* (2006.01)
*H01L 21/8244* (2006.01)

(52) U.S. Cl. .......... 438/238; 438/381; 257/E21.208; 257/E21.304; 257/E21.645; 257/E21.646

(58) Field of Classification Search ............ 438/238, 438/3, 257, 289, 381, 692, 733, 735, 736
See application file for complete search history.

(56) References Cited

U.S. PATENT DOCUMENTS 5,952,692 A * 9/1999 Nakazato et al. .......... 257/321
6,259,114 B1 * 7/2001 Misewich et al. .......... 257/43
6,475,857 B1 * 11/2002 Kim et al. ................. 438/240
6,495,878 B1 * 12/2002 Hayashi et al. ........... 257/310
6,528,896 B2 * 3/2003 Song et al. ................ 257/327
6,744,087 B2 * 6/2004 Misewich et al. .......... 257/295

FOREIGN PATENT DOCUMENTS

| EP | 0843360 | 5/1998 |
| JP | 10-200001 | 7/1998 |
| JP | 11-087541 | 3/1999 |
| KR | 1998-042429 | 8/1998 |

OTHER PUBLICATIONS

Korean Office Action dated Sep. 27, 2006.

* cited by examiner

*Primary Examiner*—David Nhu
(74) *Attorney, Agent, or Firm*—Harness, Dickey & Pierce, P.L.C.

(57) ABSTRACT

In a DRAM device and a method of manufacturing the same, a multiple tunnel junction (MTJ) structure is provided, which includes conductive patterns and nonconductive patterns alternately stacked on each other. The nonconductive patterns have a band gap larger than a band gap of the conductive patterns. A gate insulation layer and a gate electrode are formed on a sidewall of the MTJ structure. A word line is connected with the MTJ structure, and a bit line is connected with one of top and bottom surfaces of the MTJ structure. A capacitor is connected with one of top and bottom surfaces of the MTJ structure that is not connected with the bit line. Current leakage in the DRAM device is reduced and a unit cells may be vertically stacked on the substrate, so a smaller surface area of the substrate is required for the DRAM device.

11 Claims, 18 Drawing Sheets

DRAM DEVICE AND METHOD OF MANUFACTURING THE SAME

PRIORITY STATEMENT

This application claims the benefit of priority to Korean Patent Application No. 2005-18405 filed on Mar. 5, 2005, the entire contents of which is herein incorporated by reference.

BACKGROUND OF THE INVENTION

1. Field of the Invention

Example embodiment of the present invention relate to a dynamic random access memory (DRAM) device and a method of manufacturing the same, and more particularly to an integrated DRAM device and a method of manufacturing the same.

2. Description of the Related Art

Conventionally, a unit cell of a DRAM device may include one pass transistor and one capacitor that may be electrically connected in series. A pass transistor may control the movement of electrons into and/or out of a device, thereby functioning as a switching element controlling whether electrons are accumulated in or charged from a capacitor. Data may be stored and/or erased in a DRAM device when electrons are accumulated into or charged from a capacitor.

A conventional pass transistor in a DRAM device may include a planar gate electrode. In a planar gate electrode, a channel length may decrease proportionally with a decrease of a line width of a gate electrode. Accordingly, when a design rule for a DRAM device is no more than about 100 nm, the DRAM device is frequently influenced by a short channel effect, which may generate an operation failure in the DRAM device.

A conventional DRAM device may further include a connection member for electrically connecting a pass transistor and a capacitor. Accordingly, an accurate aligning process is normally required when forming a connection member. Because of the accurate aligning process, obtaining an area of $4F^2$ (wherein, F indicates a critical dimension of the DRAM) for a DRAM is difficult.

A pass transistor in a conventional DRAM may be formed on a silicon substrate and/or a silicon layer grown by an epitaxial process (hereinafter, referred to as silicon epitaxial layer). Vertically stacking a pass transistor on a silicon substrate or silicon epitaxial layer may be difficult. Accordingly, vertically stacking a unit cell of a conventional DRAM on a substrate to form a multilayer structure is difficult.

For at least the above reasons, increasing an integration degree of conventional DRAM devices has been difficult.

SUMMARY OF THE INVENTION

An example embodiment of the present invention provides a highly integrated DRAM device.

An example embodiment of the present invention provides a method of manufacturing a highly integrated DRAM device.

An example embodiment of the present invention provides a DRAM structure. The DRAM structure may include a multiple tunnel junction (MTJ) structure, a gate electrode, a bit line and a word line and a capacitor. The MTJ structure includes conductive patterns and nonconductive patterns alternately stacked on each other. The nonconductive patterns have a band gap higher than a band gap of the conductive patterns. A gate insulation layer and a gate electrode on the gate insulation layer are formed on a sidewall of the MTJ structure. The word line is electrically connected with the MTJ structure, and the bit line is electrically connected with one of the top and bottom surfaces of the MTJ structure. The capacitor is connected with the one of top and bottom surfaces of the MTJ structure that is not connected with the bit line.

An example embodiment of the present invention provides a DRAM structure. The DRAM structure includes a capacitor, a multiple tunnel junction (MTJ) structure, an insulation layer, a bit line and a word line. The capacitor is formed on a substrate. The MTJ structure contacts the capacitor and includes conductive patterns and nonconductive patterns alternately stacked on each other. The nonconductive patterns have a band gap larger than the conductive pattern. The bit line is formed on the MTJ structure in a first direction, and the insulation layer is formed on a top surface of the capacitor, on a sidewall of the MTJ structure and on a top surface of the bit line. The word line is formed on the insulation layer in a second direction perpendicular to the first direction, and the word line faces the sidewall of the MTJ structure.

An example embodiment of the present invention provides a DRAM device. The DRAM device includes a first operation unit (e.g., DRAM structure) and a second operation unit (e.g., DRAM structure) vertically stacked on a substrate. The first operation unit includes a first conductive layer on a substrate and a first capacitor on the first conductive layer. The first operation unit also includes a first multiple tunnel junction (MTJ) structure contacting a storage electrode of the first capacitor and including conductive patterns and nonconductive patterns alternately stacked on each other. A first bit line is formed on the first MTJ structure in a first direction, and a first insulation layer is formed on a top surface of the first capacitor, a sidewall of the first MTJ structure and a top surface of the first bit line. A first word line is formed on the first insulation layer in a second direction perpendicular to the first direction. The nonconductive patterns have a band gap larger than that of the conductive patterns and the first word line faces the sidewall of the first MTJ structure at a lower portion of the first MTJ structure. A first insulation interlayer is formed on the first operation unit with a thickness sufficient to cover the first operation unit. The second operation unit includes a second conductive layer on the first insulation interlayer and a second capacitor on the second conductive layer. The second operation unit also includes a second multiple tunnel junction (MTJ) structure making contact with a storage electrode of the second capacitor and including conductive patterns and nonconductive patterns alternately stacked on each other. A second bit line is formed on the second MTJ structure in the first direction. A second insulation layer is formed on a top surface of the second capacitor, a sidewall of the second MTJ structure and a top surface of the second bit line. A second word line is formed on the second insulation layer in the second direction. The nonconductive pattern has a band gap larger than that of the conductive pattern, and the second word line faces the sidewall of the second MTJ structure at a lower portion thereof.

An example embodiment of the present invention provides a method of manufacturing a DRAM device. The method may include forming a multiple tunnel junction (MTJ) structure including conductive patterns and nonconductive patterns alternately stacked on each other, each nonconductive pattern having a band gap larger than a band gap of each conductive pattern; forming a first insulation layer along a sidewall of the MTJ structure; forming a gate electrode on the first insulation layer; forming a word line electrically connected with the MTJ structure; forming a bit line electrically connected with one of a top surface and a bottom surface of the MTJ structure; and forming a capacitor electrically connected with one of a top surface and a bottom surface of the MTJ structure that is not connected with the bit line.

An example embodiment of the present invention provides a method of manufacturing a DRAM device. The method may include forming a preliminary storage electrode on a substrate having a line shape extending in a first direction; forming a preliminary multiple tunnel junction (MTJ) structure on the preliminary storage electrode, the MTJ structure including conductive layers and nonconductive layers alternately stacked on each other, each nonconductive layer having a band gap larger than a band gap of each conductive layer; forming a conductive layer on the preliminary MTJ structure; partially etching the conductive layer, the preliminary MTJ structure and the preliminary storage electrode in a second direction perpendicular to the first direction until a top surface of the substrate is exposed, thereby forming a bit line extending in the second direction and a plurality of MTJ structures and storage electrodes isolated from each other; forming a first dielectric layer on a sidewall of the storage electrodes; forming a plate electrode between adjacent storage electrodes so that a sidewall of the plate electrode contacts with the first dielectric layer; forming an insulation layer on a top surface of the plate electrode, a sidewall of the MTJ structure and a top surface of the bit line; and forming a word line on the insulation layer in the second direction, the word line facing the sidewall of the MTJ structure.

An example embodiment of the present invention provides a method of manufacturing a DRAM device. The method may include forming a first operation unit and a second operation unit. A first operation unit may be formed on a substrate. The first operation unit may include a first conductive layer on a substrate, a first capacitor on the first conductive layer and a first multiple tunnel junction (MTJ) structure contacting a storage electrode of the first capacitor and including conductive patterns and nonconductive patterns alternately stacked on each other. A first bit line may be formed on the first MTJ structure in a first direction, and a first insulation layer formed on a top surface of the first capacitor, a sidewall of the first MTJ structure and a top surface of the first bit line. A first word line may be formed on the first insulation layer in a second direction perpendicular to the first direction. The nonconductive patterns have a band gap larger than a band gap of the conductive pattern, and the first word line may face a sidewall of the first MTJ structure at a lower portion thereof. The method may also include forming a first insulation interlayer on the first operation unit with a thickness sufficient to cover the first insulation interlayer. Still further, the method may include forming a second operation unit on the first insulation interlayer. The second operation unit may include a second conductive layer on the first insulation interlayer, a second capacitor on the second conductive layer, and a second multiple tunnel junction (MTJ) structure contacting a storage electrode of the second capacitor and including conductive patterns and nonconductive patterns alternately stacked on each other. A second bit line may be formed on the second MTJ structure in the first direction. A second insulation layer may be formed on a top surface of the second capacitor, a sidewall of the second MTJ structure and a top surface of the second bit line, and a second word line formed on the second insulation layer in the second direction. The nonconductive patterns have a band gap larger than a band gap of the conductive patterns and the second word line may face the sidewall of the second MTJ structure at a lower portion thereof.

According to an example embodiment of the present invention, a channel is created vertically with respect to the substrate and a MJT structure may operate as a pass transistor in a unit cell of the DRAM device, thereby reducing and/or minimizing an influence due to a short channel effect and improving operation characteristics of a DRAM device. Further, a plurality of unit cells of a DRAM device may be vertically stacked on a substrate. As a result, a small surface area of the substrate may be sufficient for manufacturing the DRAM device, thereby increasing an integration degree of the DRAM device.

BRIEF DESCRIPTION OF THE DRAWINGS

Example embodiments of the present invention will be more clearly understood from the detailed description taken in conjunction with the accompanying drawings.

DESCRIPTION OF EXAMPLE EMBODIMENTS OF THE PRESENT INVENTION

Figure 1:
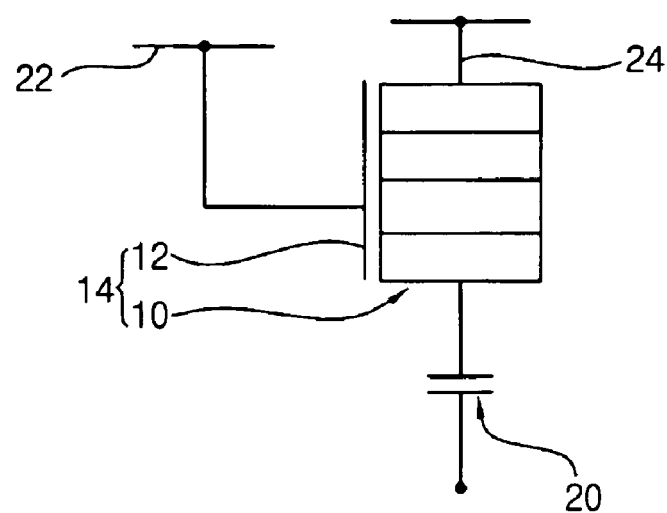
FIG. 1 is a circuit diagram illustrating a DRAM device according to an example embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a circuit diagram illustrating a DRAM device according to an example embodiment of the present invention.

Referring to FIG. 1, a DRAM device according to an example embodiment of the present invention may include a multiple tunnel junction (MTJ) transistor 14 and a capacitor 20.

An MTJ transistor 14 may include an MTJ structure 10, a gate insulation pattern and a gate electrode 12, which may be arranged along a sidewall of the MTJ structure 10. An MTJ structure 10 may include a conductive pattern and a nonconductive pattern alternately stacked on each other. A nonconductive pattern may have a larger band gap than a conductive pattern. In an MTJ structure 10, a top conductive pattern may function as a source electrode of a transistor, and a bottom conductive pattern may function as a drain electrode of a transistor. A nonconductive pattern of an MTJ structure 10 may have such a thin thickness that electrons may sufficiently pass therethrough. For example, a thickness of a nonconductive pattern may range from about 30 Å to about 500 Å. Further, a nonconductive pattern may have a thickness of about 30 Å to about 100 Å in an example embodiment of the present invention.

In an example embodiment of the present invention, an MTJ structure 10 may include n conductive patterns and (n−1) nonconductive patterns sequentially interposed between adjacent conductive patterns arranged. Accordingly, a number of (2n−1) patterns may be alternately stacked on each other, and top and bottom patterns of an MTJ structure 10 correspond to the $n^{th}$ conductive pattern and the first conductive pattern, respectively. An $n^{th}$ conductive pattern may be a source electrode of an MTJ transistor, and a first conductive pattern may be a drain electrode of an MTJ transistor. A first and $n^{th}$ conductive pattern may include polysilicon doped with first polarity type dopants, and residual conductive patterns except the first and the $n^{th}$ conductive patterns may include polysilicon doped with second polarity type dopants that are electrically opposite to the first polarity type dopants.

For example, if an MTJ structure 10 includes four conductive patterns, the MTJ structure 10 includes a first conductive pattern including polysilicon doped with first polarity type dopants; a first nonconductive pattern having a band gap larger than that of the first conductive pattern that is arranged on the first conductive pattern; a second conductive pattern including polysilicon doped with second polarity type dopants arranged on the first nonconductive pattern; a second nonconductive pattern arranged on the second conductive pattern; a third conductive pattern including polysilicon doped with second polarity type dopants arranged on the second nonconductive pattern; a third nonconductive pattern arranged on a third conductive pattern;

and a fourth conductive pattern including polysilicon doped with first polarity type dopants arranged on the third nonconductive pattern.

Hereinafter, an operation of an MTJ transistor 14 according to an example embodiment of the present invention including an MTJ structure 10 having four conductive patterns is described. As described above, a fourth conductive pattern, which may be a top conductive pattern, may be a source electrode of an MTJ transistor 14, and a first conductive pattern, which may be a bottom conductive pattern, may be a drain electrode of an MTJ transistor 14.

Figure 2:
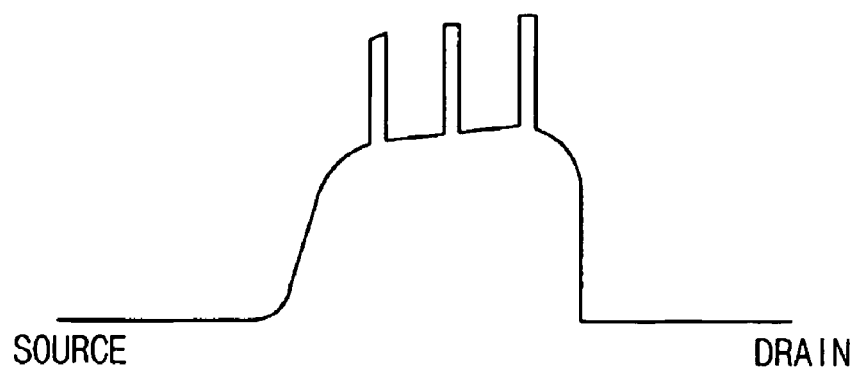
FIG. 2 is an example energy band diagram of an MTJ transistor when no voltage is applied to the source and gate electrodes.
Figure 3:
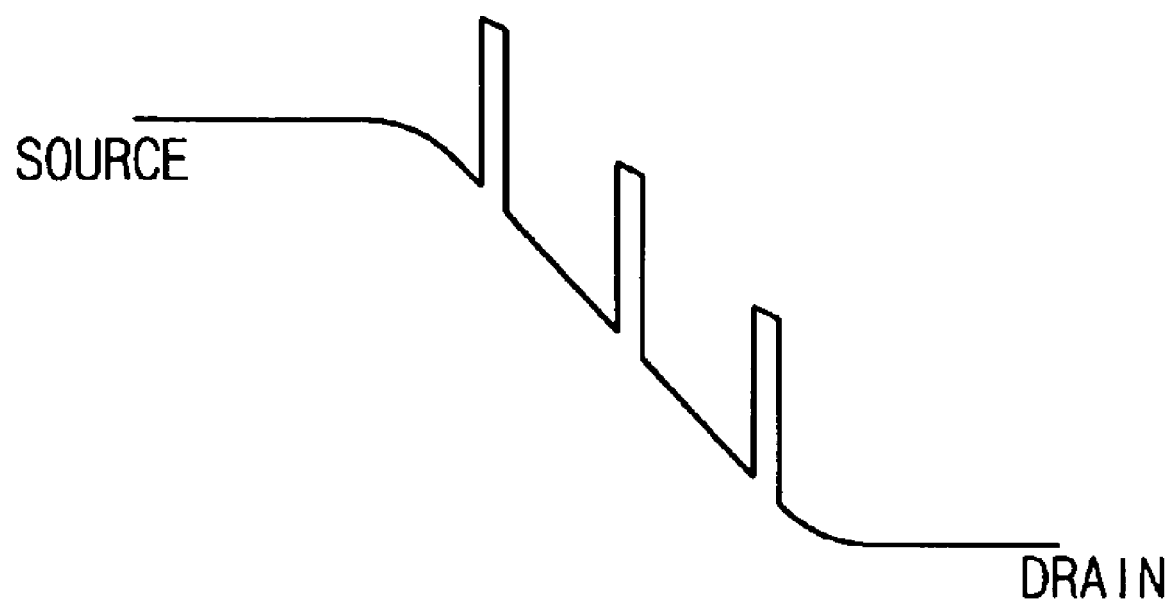
FIG. 3 is an example energy band diagram of an MTJ transistor when a voltage is applied to the source and gate electrodes.

FIG. 2 is an example energy band diagram of an MTJ transistor when no voltage is applied to the source and gate electrodes, and FIG. 3 is an energy band diagram of an MTJ transistor when a voltage is applied to the source and gate electrodes.

According to an example embodiment of the present invention as shown in FIG. 2, if no voltage is applied to a fourth conductive pattern and the gate electrodes 12, an energy barrier is created between the source and drain electrodes due to an energy level difference between the fourth conductive pattern and a third conductive pattern that is at least partially due to a large band gap of the first, second and third nonconductive patterns. As a result, electrons in the fourth conductive pattern hardly move into the first conductive pattern, thereby decreasing current leakage as compared with a conventional planar transistor.

According to an example embodiment of the present invention as shown in FIG. 3, if a gate voltage that is above a threshold voltage is applied to the gate electrode 12 and a source voltage is applied to a fourth conductive pattern, an energy level of the fourth conductive pattern increases due to the gate voltage, and an energy level of third and second conductive patterns decreases due to the source voltage. Although the first, second and third nonconductive patterns have large band gap, a thickness of the band gap is sufficiently small for the electrons to pass through. As a result, electrons in the fourth conductive pattern move to the first conductive pattern through a first, second and third nonconductive patterns and a second and third conductive patterns.

According to an example embodiment of the present invention, an MTJ transistor 14 is not necessarily formed on a silicon substrate and/or on a silicon epitaxial layer. For example, an MTJ transistor 14 may be formed on a polycrystalline silicon layer. Accordingly, an MTJ transistor 14 may be formed above a substrate as well as on a substrate in a DRAM device. Still further, unit cells of a DRAM device may be vertically stacked on a substrate according to an example embodiment of the present invention.

According to an example embodiment of the present invention, a word line 22 may be electrically connected with a gate electrode 12. A word line 22 may include a same material as a gate electrode 12 and may be integrally formed with a gate electrode.

According to an example embodiment of the present invention, a bit line 24 may be electrically connected with a top conductive pattern. A capacitor 20, in particular, a storage electrode of a capacitor 20 may be electrically connected with a bottom conductive pattern. A bit line 24 may include the same material as a top conductive pattern and be integrally formed with the top conductive pattern. A storage electrode of a capacitor 20 may also include the same material as a bottom conductive pattern and may be integrally formed with a bottom conductive pattern.

According to an example embodiment of the present invention, another structure converse to the above connection structure may be adapted for a DRAM. For example, a bit line 24 may be electrically connected with a bottom conductive pattern, and a storage electrode of a capacitor 20 may be electrically connected with a top conductive pattern. A bit line 24 may include the same material as the bottom conductive pattern and may be integrally formed with a bottom conductive pattern. A storage electrode of a capacitor 20 may also include the same material as a top conductive pattern and be integrally formed with a top conductive pattern.

According to an example embodiment of a DRAM device of the present invention, if a pass transistor in a unit cell is operated, a channel may be vertically formed in the DRAM device, which may reduce failures due to a short channel effect. Further, according to an example embodiment of the present invention, each element of the unit cell may be vertically stacked on a substrate, so that the unit cell of the DRAM requires a small surface area of a substrate. Furthermore, a pass transistor may also be formed on a conductive layer including polysilicon as well as a substrate. Accordingly, unit cells of a DRAM may be vertically stacked on a substrate as a multilayer structure, which may improve the integration degree of a DRAM device.

Figure 4:
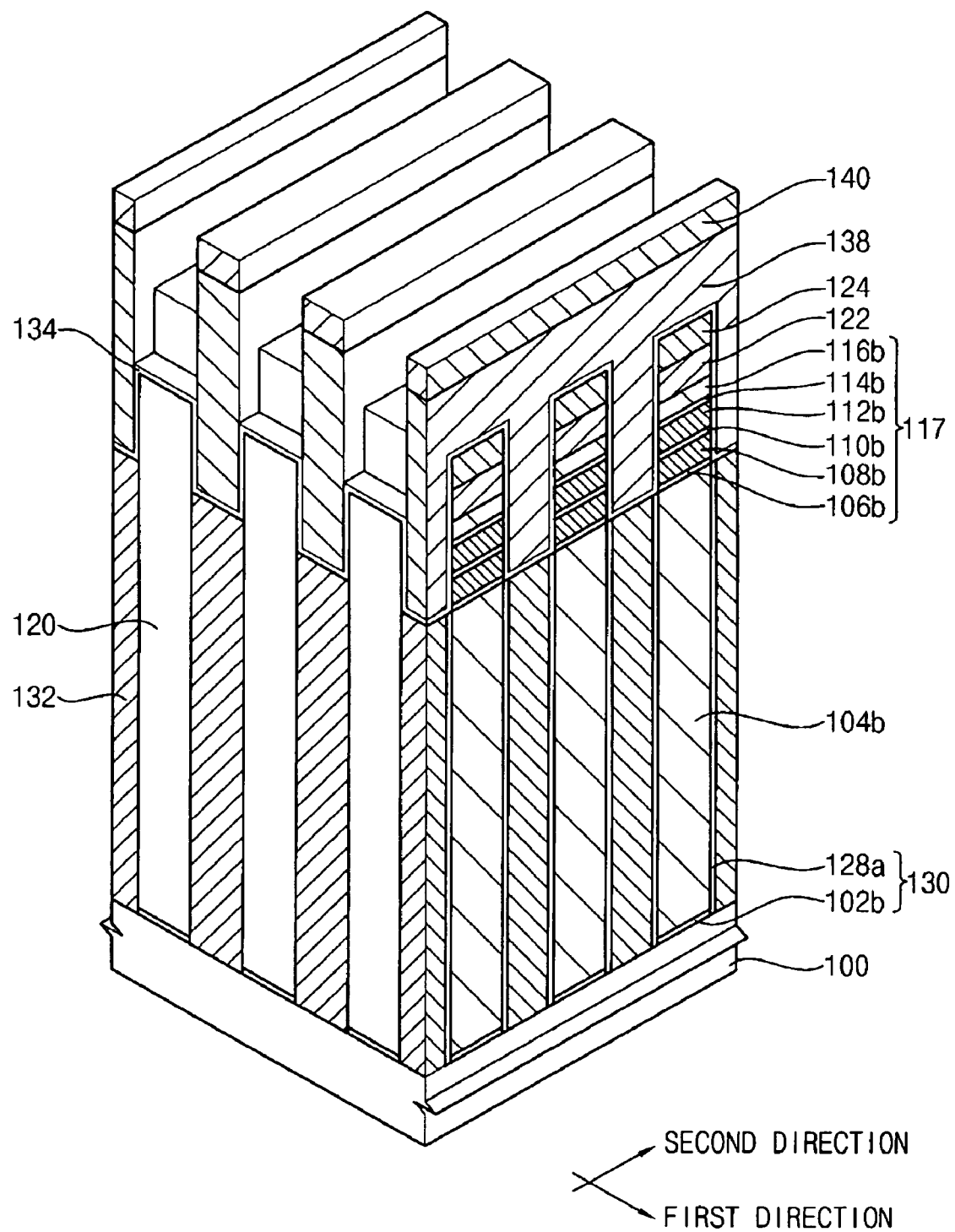
FIG. 4 is a perspective view illustrating a DRAM device according to an example embodiment of the present invention.
Figure 5:
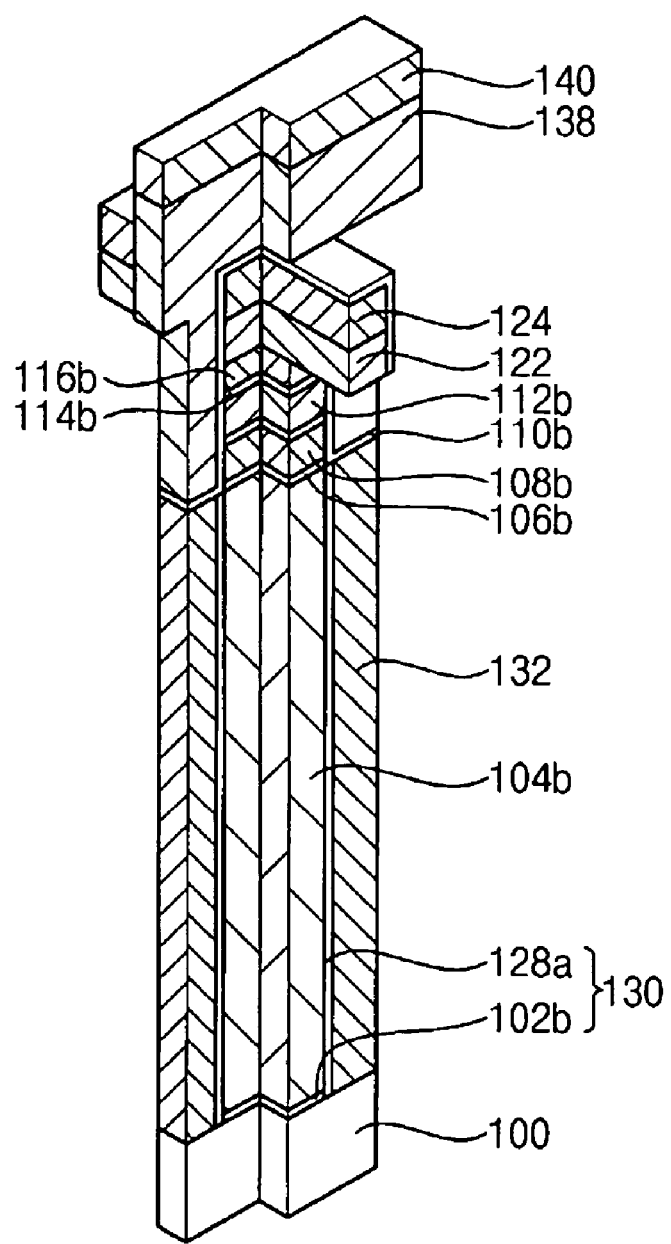
FIG. 5 is a perspective view illustrating a unit cell of a DRAM device according to an example embodiment of the present invention as shown in FIG. 4.

FIG. 4 is a perspective view illustrating a DRAM device according to an example embodiment of the present invention, and FIG. 5 is a perspective view illustrating a unit cell of a DRAM device according to an example embodiment of the present invention as shown in FIG. 4.

Referring to FIGS. 4 and 5, a device isolation pattern 120 may be formed on a substrate 100 in a line shape extending in a second direction. A top surface of a device isolation pattern 120 may be coplanar with a top surface of a MJT structure 117.

Capacitors may be formed on a substrate 100 and may be exposed through a device isolation pattern 120. Each capacitor may include a plate electrode 132, a dielectric layer 130 and a storage electrode 104*b*.

A plate electrode 132 may have a column shape extending vertically to a substrate 100. Impurities may be doped into a surface portion of a substrate 100 contacting a plate electrode 132, thereby forming a boundary conductive layer between a plate electrode 132 and a substrate 100. A dielectric layer 130 may be formed on sidewalls of a plate electrode 132 and/or on a substrate 100 between the pate electrodes 132. A storage electrode 104*b* may be formed on a dielectric layer 130 in a space defined by two adjacent column-shaped plate electrodes 132. Two capacitors each of which may include a storage electrode 104*b* and a plate electrode 132 adjacent to each other in a first direction that is substantially perpendicular to the first direction may be separated from each other by a device isolation pattern 120.

A storage electrode 104*b* may include a conductive material arranged between column-shaped plate electrodes 132. The conductive material may include polysilicon doped with first polarity type impurities. A storage electrode 104*b* may function as a source electrode and/or a drain electrode of an MTJ transistor. However, a storage electrode 104*b* is described as a source electrode of an MTJ transistor hereinafter because an operation of the DRAM device according to an example embodiment of the present invention is described herein based on a data reading operation.

According to an example embodiment of the present invention, a multiple tunnel junction (MTJ) structure 117 may be arranged on a capacitor, more particularly, on a storage electrode 104*b* of a capacitor. An MTJ structure 117 may include conductive patterns and nonconductive patterns alternately stacked on each other. A nonconductive pattern may have a band gap larger than that of a conductive pattern.

An MTJ structure 117 may include n conductive patterns and (n−1) nonconductive patterns sequentially interposed between adjacent conductive patterns (wherein, n is less than four). As a result, a number of (2n−1) patterns may be alternately stacked on each other. Two MTJ structures 117 adjacent to each other in the first direction may be separated from each other by a device isolation pattern 120. An MTJ structure 117 may be individually formed on every storage electrode 104b to thereby have an isolated pattern shape. First polarity type impurities may be doped into conductive patterns corresponding to source and drain electrodes of an MTJ transistor, and second polarity type impurities may be doped into conductive patterns corresponding to a channel of an MTJ transistor. According to an example embodiment of the present invention, an energy barrier may be created between the source/drain electrodes and a channel because an energy level of conductive patterns corresponding to the source and drain electrodes may be different from that of conductive patterns corresponding to a channel. Accordingly, current leakage may be reduced if an MTJ transistor is in a standby mode, for example.

In an example embodiment of the present invention, an MTJ structure 117 may include three conductive patterns and three nonconductive patterns, e.g., first, second and third conductive patterns 108b, 112b and 116b and first, second and third nonconductive patterns 106b, 110b and 114b. A storage electrode 104b may be a source electrode of an MTJ transistor and may include polysilicon doped with first polarity type impurities. A first nonconductive pattern 106b may be arranged on a storage electrode 104b.

A first nonconductive pattern 106b may include silicon nitride, silicon oxide, metal oxide, etc. These materials may be used alone or in combinations thereof for forming a nonconductive pattern 106b. A thickness of a first nonconductive pattern 106b may be sufficiently small for electrons to pass through the first nonconductive pattern 106b if an MTJ transistor is operated. For example, a first nonconductive pattern 106b may include silicon nitride and may be formed having a thickness of about 30 Å to about 500 Å. Further, a first nonconductive pattern 106b may be formed having a thickness of about 30 Å to about 100 Å.

A first conductive pattern 108b may be arranged on a first nonconductive pattern 106b and may include polysilicon doped with second polarity type impurities.

A second nonconductive pattern 110b, a second conductive pattern 112b, a third nonconductive pattern 114b and a third conductive pattern 116b may be sequentially arranged on a first conductive pattern 108b. A second conductive pattern 112b may include polysilicon doped with second polarity type impurities, and a third conductive pattern 116b may include polysilicon doped with first polarity type impurities. A third conductive pattern 116b may be a drain electrode of an MTJ transistor.

A bit line 122 may be arranged on an MTJ structure 117. A bit line 122 may extend in the first direction, and may include a conductive material having a lower electrical resistance than a third conductive pattern 116b. Alternatively, a bit line 122 may include the same material as a third conductive pattern 116b and be integrally formed with a third conductive pattern 116b.

According to an example embodiment of the present invention, a first hard mask pattern 124 may be arranged on a bit line 122, so that a word line 138 is further separated from a bit line 122 by a thickness of a first hard mask pattern 124, which may reduce a parasitic capacitance between a word line 138 and a bit line 122.

An insulation layer 134 may be arranged on a top surface of a plate electrode 132, on a sidewall of an MTJ structure 117, on a sidewall of a bit line 122 and on a sidewall and top surface of a hard mask pattern 124. A first portion of an insulation layer 134, which may be formed on a top surface of a plate electrode 132 and a sidewall of a bit line 122, may function as an insulation interlayer. A second portion of an insulation layer 134, which may formed on a sidewall of an MTJ structure 117, may function as a gate insulation layer of a transistor.

A word line 138 may be arranged on an insulation layer 134 in the first direction. Accordingly, a word line 138 may be substantially perpendicular to a bit line 122 and may face a sidewall of an MTJ structure 117. A word line 138 may also function as a gate electrode of an MTJ transistor. A second hard mask pattern 140 may be arranged on a word line 138.

A unit cell of the DRAM device according to an example embodiment of the present invention may be formed on a surface area of $4F^2$ (wherein, F denotes a critical dimension of the DRAM). Accordingly, a DRAM device according to an example embodiment of the present invention may be highly integrated as compared with conventional devices.

FIGS. 6 to 13 are perspective views illustrating a method of manufacturing DRAM device as shown in FIG. 4 in accordance with an example embodiment of the present invention.

Figure 6:
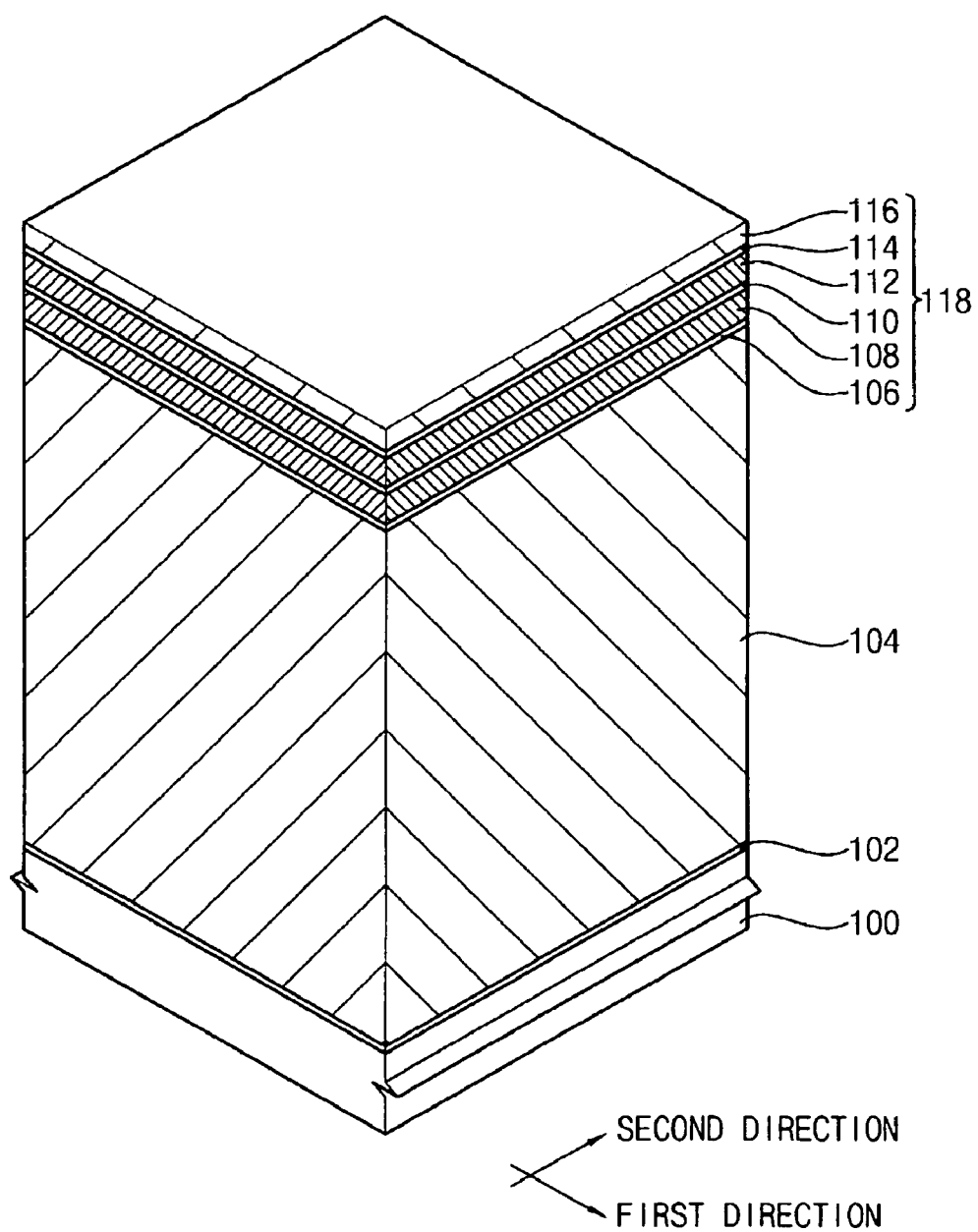
FIGS. 6 to 13 are perspective views illustrating processing operations for a method of manufacturing a DRAM device as shown in FIG. 4 in accordance with an example embodiment of the present invention.

According to an example embodiment of the present invention as shown in FIG. 6, an insulation material may be deposited onto a substrate 100 doped with impurities to form a first dielectric layer 102 on a substrate 100. A first conductive layer 104 may be formed on a first dielectric layer 102. The first conductive layer 104 may have a thickness determined based on a capacitance of a capacitor in a unit cell of a DRAM device. A first conductive layer 104 may be formed (e.g., etched, patterned, etc.) into a storage electrode of a capacitor in a subsequent process, and is referred to as preliminary storage electrode hereinafter. According to an example embodiment of the present embodiment, a first conductive layer 104 may be formed to a thickness of about 5000 Å to about 15000 Å.

A first conductive layer 104 may also function as a source pattern of an MTJ transistor in a subsequent process. A unit cell of a DRAM device may include an N type transistor. Accordingly, a first conductive layer 104 may include polysilicon doped with N type impurities and function as a source pattern of an MTJ transistor.

A first nonconductive layer 106 may be formed on a first conductive layer 104, and may have a larger a band gap than a first conductive layer 104. A first nonconductive layer 106 may include silicon nitride, silicon oxide, metal oxide, etc. These materials may be used alone or in combinations thereof to form a first nonconductive layer 106. Further, a first nonconductive layer 106 may be formed having a sufficiently small thickness for electrons to pass through a first nonconductive layer 106. A first nonconductive layer 106 may include silicon nitride and may be formed having a thickness of about 5 Å to about 50 Å, and more particularly, formed having a thickness of about 20 Å to about 40 Å.

A second conductive layer 108 may be formed on a first nonconductive layer 106 and may include polysilicon doped with P-type impurities. A second conductive layer 108 may be formed having a thickness of about 300 Å to about 2000 Å, and more particularly, formed having a thickness of about 400 Å to about 1000 Å.

A second nonconductive layer 110 may be formed on a second conductive layer 108, and a third conductive layer 112 may be formed on a second nonconductive layer 110. A second nonconductive layer 110 may have a band gap larger than a second conductive layer 108. A third conductive layer 112 may include polysilicon doped with P-type impurities. A third nonconductive layer 114 may be formed on a third conductive layer 112, and a fourth conductive layer 116 may be formed on a third nonconductive layer 114. A third nonconductive layer 114 may have a band gap larger than a third conductive layer 112. A fourth conductive layer 116 may include polysilicon doped with N type impurities.

Second and third conductive layers 108 and 112 may function as a channel region of an MTJ transistor, and a fourth conductive layer 116 may function as a drain electrode of an MTJ transistor.

Figure 8:
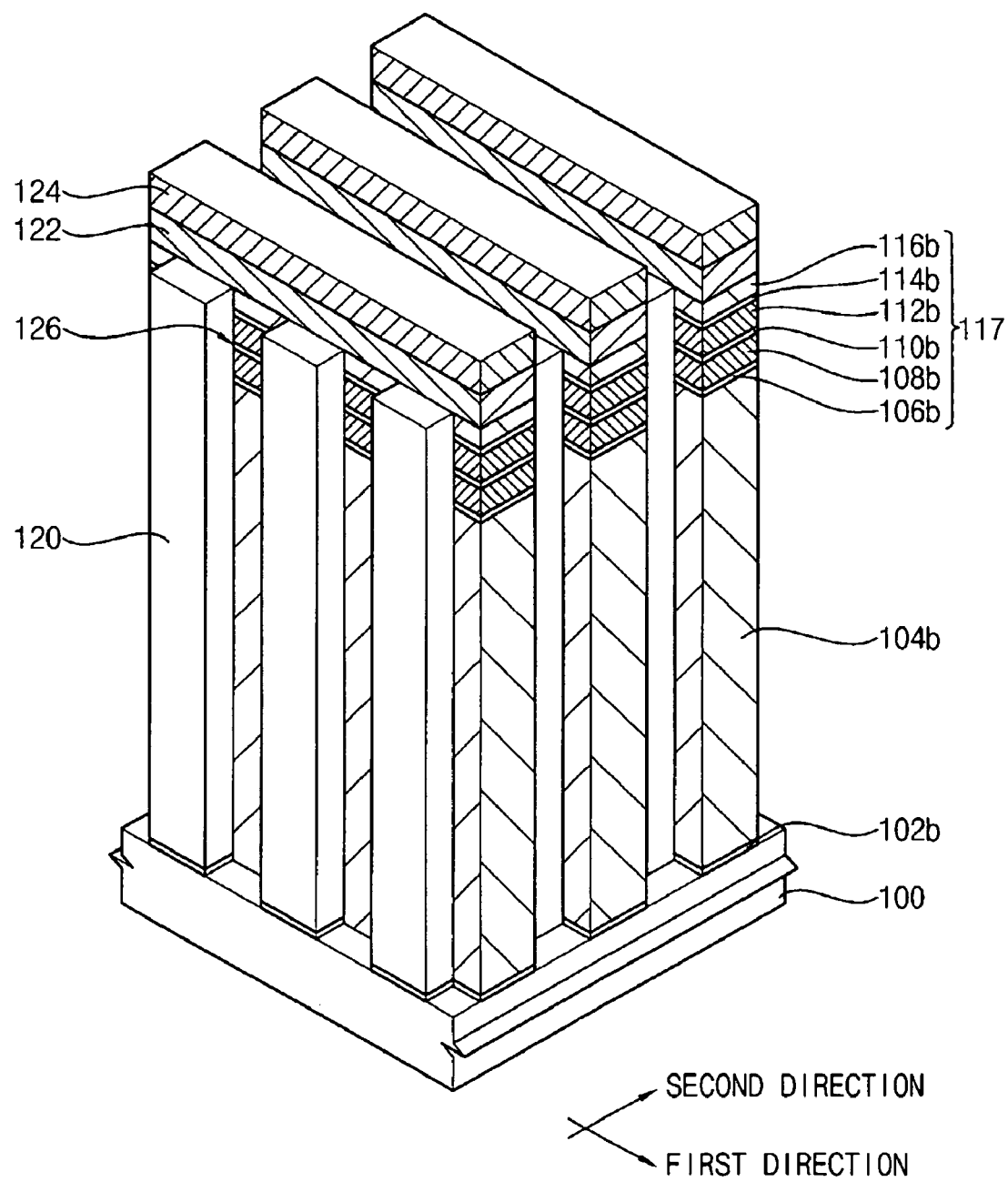

A fourth conductive layer 116, a third nonconductive layer 114, a third conductive layer 112, a second nonconductive layer 110, a second conductive layer 108 and a first nonconductive layer 106 may be formed into an MTJ structure 117 as shown in FIG. 8 according to an example embodiment of the present invention. Accordingly, the above-stacked layers are referred to collectively as preliminary MTJ structure 118.

Figure 7:
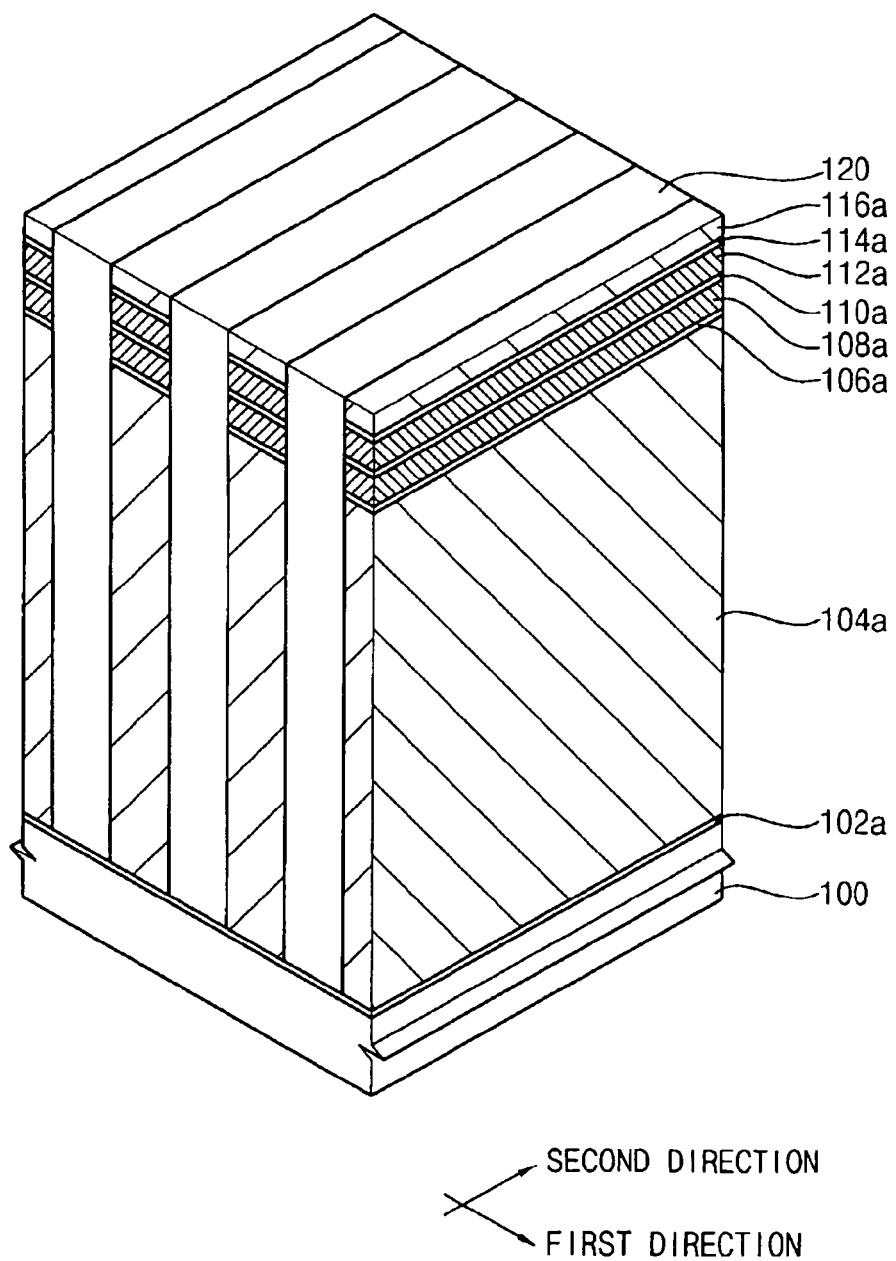

Referring to FIG. 7, a mask pattern (not shown) may be arranged on a fourth conductive layer 116 and may define an active region in which conductive structures may be formed. According to an example embodiment of the present invention, a mask pattern may be arranged in a line shape extending in the second direction and may include silicon nitride.

A fourth conductive layer 116, a third nonconductive layer 114, a third conductive layer 112, a second nonconductive layer 110, a second conductive layer 108, a first nonconductive layer 106, a first conductive layer 104 and a first dielectric layer 102 may be sequentially etched away using a mask pattern as an etching mask, thereby forming a trench for device isolation on a substrate 100. A small amount of etching against a substrate 100 underlying a first dielectric layer 102 may be allowed during the above-described etching process.

Accordingly, a fourth conductive layer 116, a third nonconductive layer 114, a third conductive layer 112, a second nonconductive layer 110, a second conductive layer 108, a first nonconductive layer 106, a first conductive layer 104 and a first dielectric layer 102 may be formed into a preliminary fourth conductive pattern 116a, a preliminary third nonconductive pattern 114a, a preliminary third conductive pattern 112a, a preliminary second nonconductive pattern 110a, a preliminary second conductive pattern 108a, a preliminary first nonconductive pattern 106a, a preliminary first conductive pattern 104a and a preliminary first dielectric pattern 102a, respectively. The above-identified preliminary patterns may be formed into a line shape extending the second direction due to the mask pattern.

An insulation layer (not shown) may be formed on a preliminary fourth conductive pattern 116a. The insulation layer may have a thickness sufficient to fill a trench for device isolation and may be planarized until a top surface of a preliminary fourth conductive pattern 116a is exposed, thereby forming a device isolation pattern 120 extending in a second direction. A top surface of the device isolation pattern 120 may be coplanar with a top surface of a preliminary fourth conductive pattern 116a. An insulation layer may include silicon oxide.

According to an example embodiment of the present invention as shown in FIG. 8, a fifth conductive layer (not shown) may be formed on a device isolation pattern 120 and a preliminary fourth conductive pattern 116a. A fifth conductive layer may be formed into a bit line during a subsequent process. A first hard mask pattern 124 may be formed on a fifth conductive layer into a line shape extending in the first direction perpendicular to a second direction.

According to an example embodiment of the present invention, a fifth conductive layer may be etched away using a first hard mask pattern 124 as an etching mask to forming a bit line 122 on a device isolation pattern 120 and a preliminary fourth conductive pattern 116a in the first direction. A preliminary fourth conductive pattern 116a underlying a fifth conductive layer, a preliminary third nonconductive pattern 114a, a preliminary third conductive pattern 112a, a preliminary second nonconductive pattern 110a, a preliminary second conductive pattern 108a, a preliminary first nonconductive pattern 106a, a preliminary first conductive pattern 104a and a preliminary first dielectric pattern 102a may be sequentially and partially etched away in the first direction using a first hard mask pattern as an etching mask to form a fourth conductive pattern 116b, a third nonconductive pattern 114b, a third conductive pattern 112b, a second nonconductive pattern 110b, a second conductive pattern 108b, a first nonconductive pattern 106b, a first conductive pattern 104b and a first dielectric pattern 102b, respectively on the substrate 100. According to an example embodiment of the present invention, a fourth conductive pattern 116b, a third nonconductive pattern 114b, a third conductive pattern 112b, a second nonconductive pattern 110b, a second conductive pattern 108b, a first nonconductive pattern 106b, a first conductive pattern 104b and a first dielectric pattern 102b may be formed by two consecutive etching processes in a second and the first directions perpendicular to each other, so that the above-identified conductive and nonconductive patterns may be formed into an isolated structure on a substrate 100. The above-identified etching process in the first direction may be performed such that a device isolation pattern 120 is slightly etched away.

According to an example embodiment of the present invention, portions of the above-identified preliminary patterns exposed through a bit line 122 and a device isolation pattern 120 are sequentially etched away in the above-identified etching process with a self-alignment process being performed by the bit line 122 and the device isolation pattern 120 to form an opening 126 through which a surface of the substrate may be partially exposed.

According to an example embodiment of the present invention, a pair of sidewalls of a storage electrode 104b, which face each other, may contact a device isolation pattern 120, the remaining pair of sidewalls of the storage electrode 104b, which also face each other, may not contact a device isolation pattern 120 and may be exposed.

Figure 9:
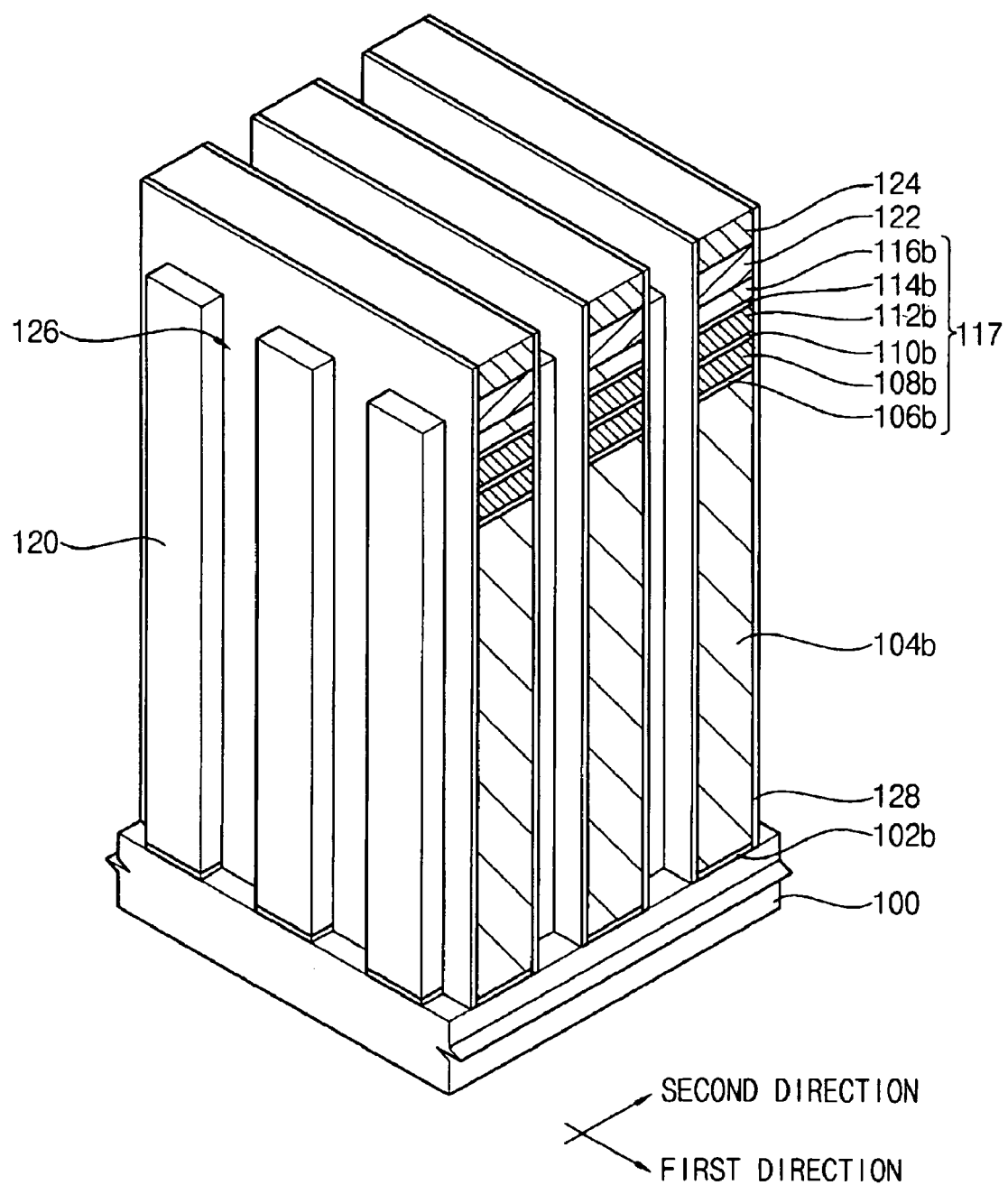

According to an example embodiment of the present invention as shown in FIG. 9, a second dielectric layer (not shown) may be formed on a surface of a substrate 100 exposed through an opening 126, sidewalls of a storage electrode 104b, a first nonconductive pattern 106b, a second conductive pattern 108b, a second nonconductive pattern 110b, a third conductive pattern 112b, a third nonconductive pattern 114b, a fourth conductive pattern 116b and bit line 122, and on a top surface and sidewalls of a hard mask pattern 124. A second dielectric layer is to be formed into a dielectric layer for a capacitor in a DRAM device.

According to an example embodiment of the present invention, an anisotropic etching process may be performed on a second dielectric layer, so the second dielectric layer is at least partially removed from the top surfaces of a substrate 100 and a first hard mask pattern 124. Accordingly, a second dielectric layer may remain only on the sidewalls of a storage electrode 104b, a first nonconductive pattern 106b, a second conductive pattern 108b, a second nonconductive pattern 110b, a third conductive pattern 112b, a third nonconductive pattern 114b, a fourth conductive pattern 116b and bit line 122, and a hard mask pattern 124, thereby forming a preliminary second dielectric pattern 128 thereon.

Accordingly, a bottom surface of a storage electrode 104b may be covered with a first dielectric pattern 102b, and sidewalls of a storage electrode 104b may be covered with a preliminary second dielectric pattern 128.

Figure 10:
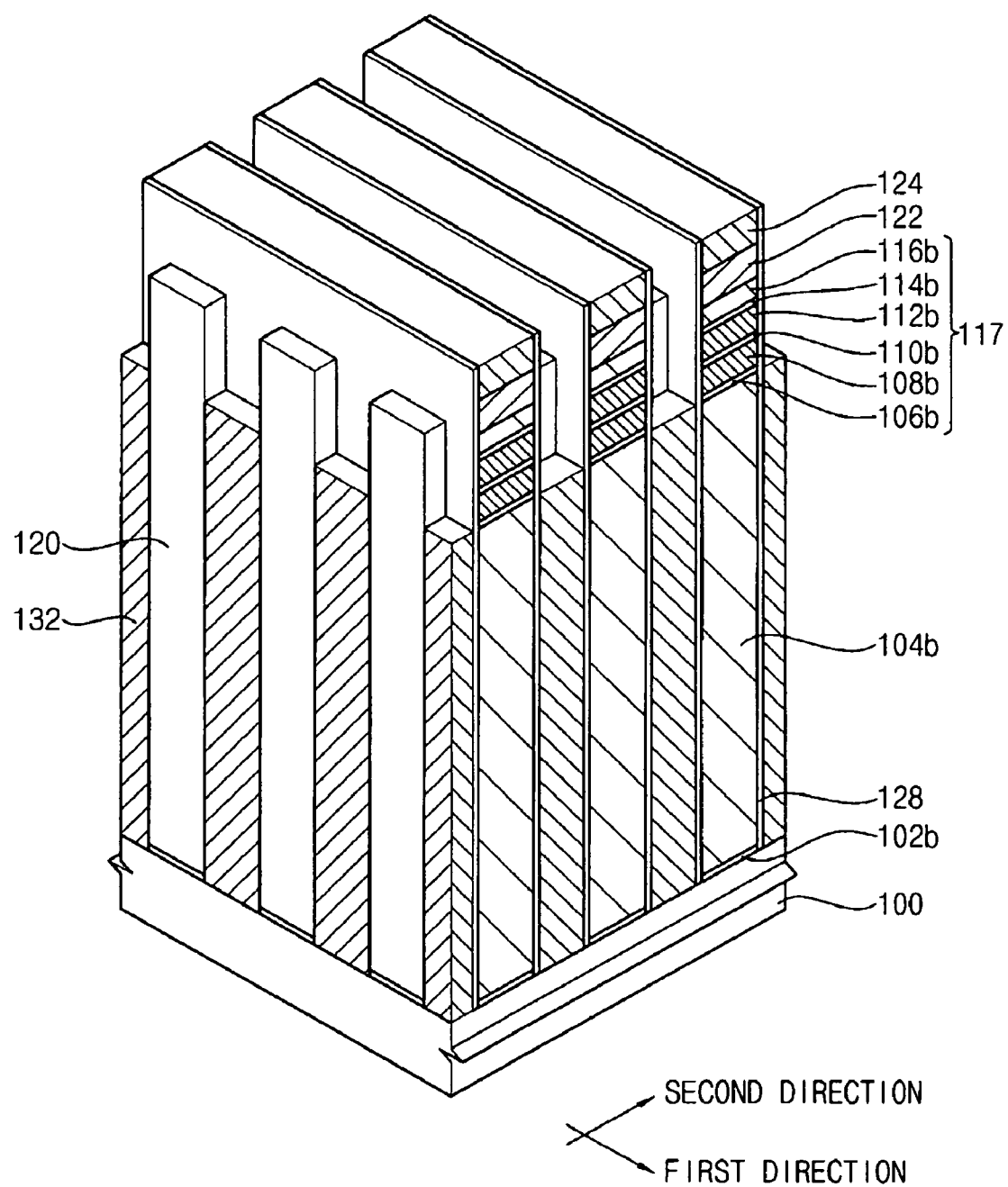

According to an example embodiment of the present invention as shown in FIG. 10, a sixth conductive layer (not shown) may be formed on a preliminary second dielectric layer 128. A sixth conductive layer may have a thickness sufficient to fill an opening 126 between a bit line 122 and a device isolation pattern 120. Then, a sixth conductive layer may be removed until a top surface thereof is lower than a top surface of a first nonconductive layer 106b and is substantially coplanar with a top surface of a storage electrode 104b, thereby forming a plate electrode 132 on a preliminary second dielectric layer 128.

For example, a sixth conductive layer may be planarized by a planarization process such as a chemical mechanical polishing (CMP) process until a top surface of a first hard mask pattern 124 is exposed. Further, a planarized sixth conductive layer may be continuously etched away by an anisotropic etching process until a top surface thereof is lower than a top surface of a first nonconductive layer 106b and is substantially coplanar with a top surface of a storage electrode 104b, thereby forming a plate electrode 132 below the top surface of the first nonconductive layer 106b.

Accordingly, a preliminary second conductive pattern 128 formed on sidewalls of a second conductive pattern 108b, a second nonconductive pattern 110b, a third conductive pattern 112b, a third nonconductive pattern 114b, a fourth conductive pattern 116b and a bit line 122 may be exposed by the above-identified planarization process and etching process according to an example embodiment of the present invention.

Figure 11:
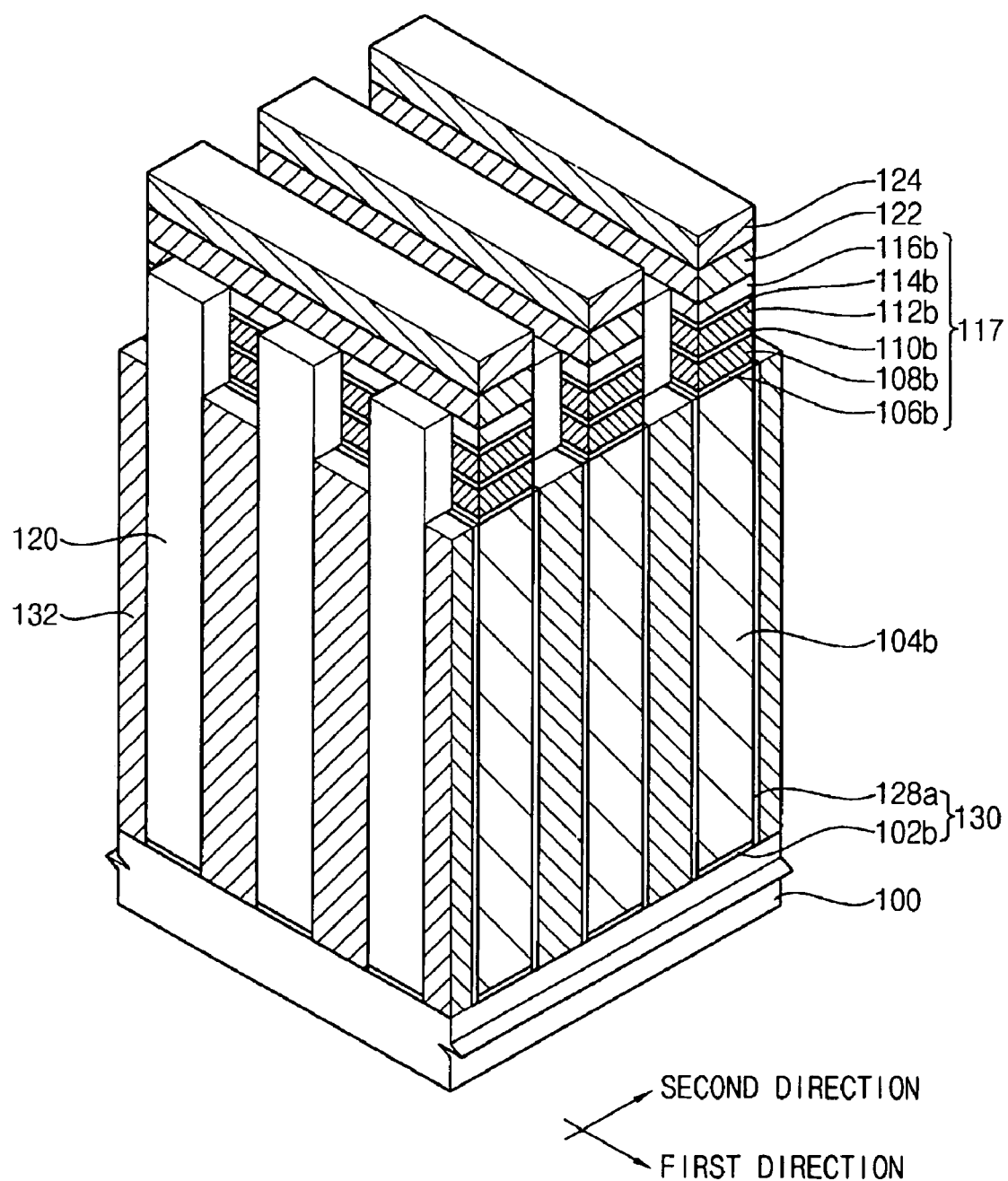

According to an example embodiment of the present invention as shown in FIG. 11, an exposed preliminary second conductive pattern 128 formed on sidewalls of a second conductive pattern 108b, a second nonconductive pattern 110b, a third conductive pattern 112b, a third nonconductive pattern 114b, a fourth conductive pattern 116b and a bit line 122 may be removed by a wet etching process, thereby forming a second dielectric pattern 128a, which may contact a storage electrode 104b. Accordingly, a second conductive pattern 108b, a second nonconductive pattern 110b, a third conductive pattern 112b, a third nonconductive pattern 114b, a fourth conductive pattern 116b and a bit line 122 may be exposed to surroundings.

A first dielectric pattern 102b may contact a bottom surface of a storage electrode 104b and a second dielectric pattern 128a may contact sidewalls of a storage electrode 104b. Accordingly, a storage electrode may be enclosed with first and second dielectric patterns 102b and 128a. Hereinafter, first and second dielectric patterns 102b and 128a are referred to as a capacitor dielectric layer 130.

Figure 12:
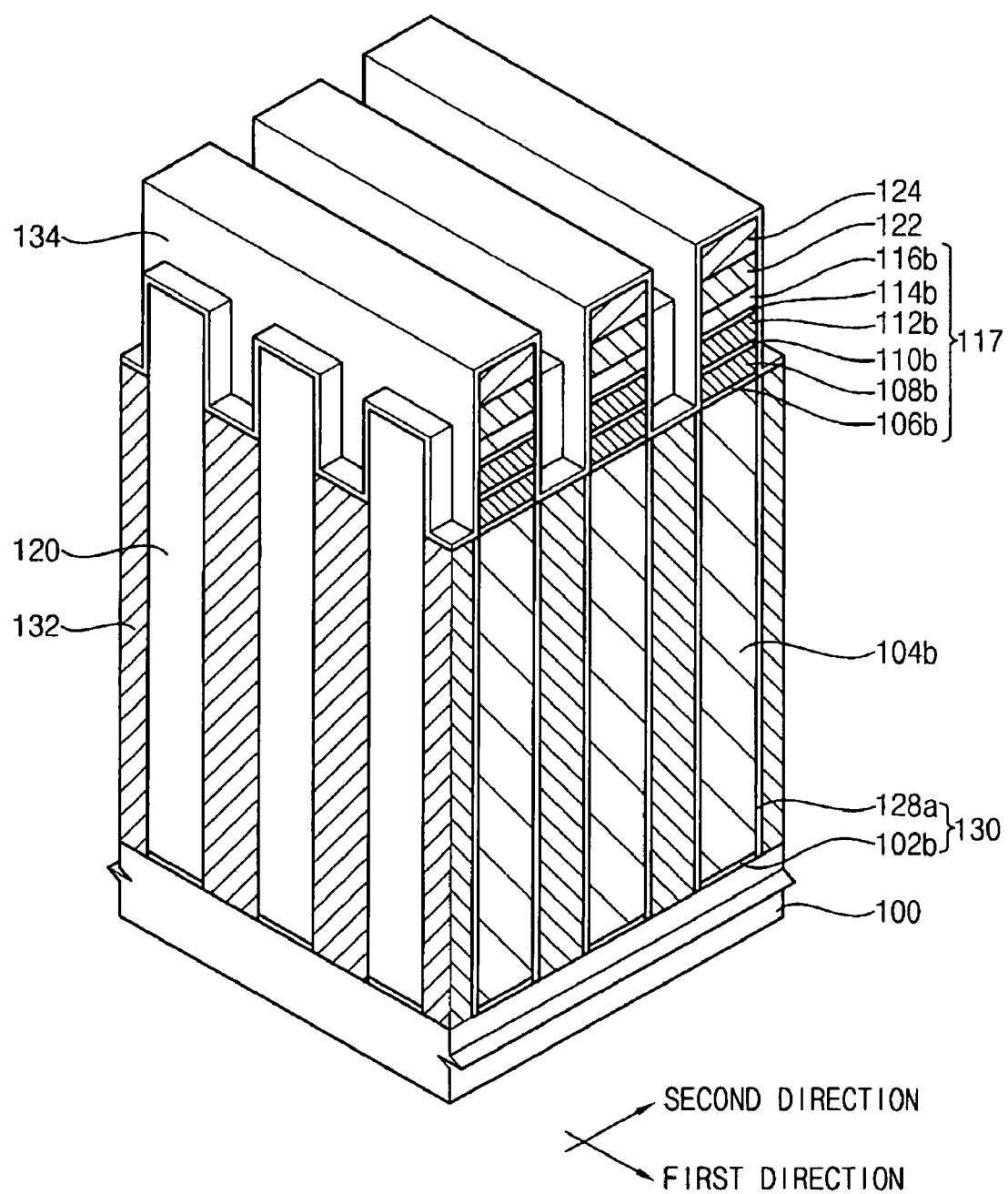

According to an example embodiment of the present invention as shown in FIG. 12, an insulation layer 134 may be formed on sidewalls of a second conductive pattern 108b, a second nonconductive pattern 110b, a third conductive pattern 112b, a third nonconductive pattern 114b, a fourth conductive pattern 116b and a bit line 122, on a top surface of a first hard mask pattern 124 and on a top surface of a device isolation pattern 120. An insulation layer 134 may be formed into a gate insulation layer for an MTJ transistor in a subsequent process. Silicon oxide may be deposited onto the above-identified sidewalls and surfaces, thereby forming a silicon oxide layer as the insulation layer 134.

Figure 13:
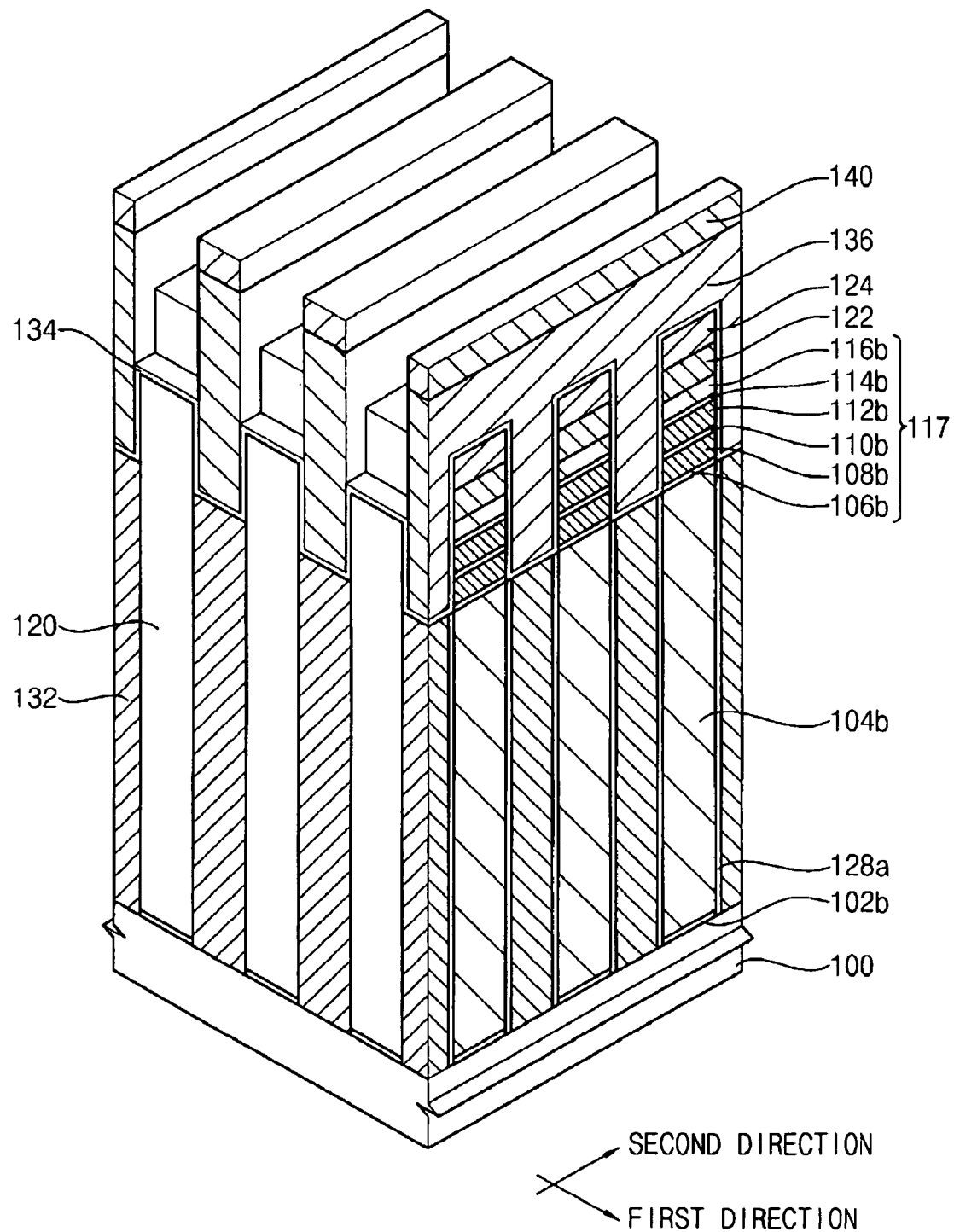

According to an example embodiment of the present invention as shown in FIG. 13, a seventh conductive layer (e.g., a word line) may be formed on an insulation layer 134, and a second hard mask pattern 140 may be formed on a seventh conductive layer in the first direction. A seventh conductive layer may be etched away using a second hard mask pattern 140 as an etching mask to form a word line 136 on an insulation layer 134. Accordingly, a word line 136 may be formed along sidewalls of a second conductive pattern 108b, a second nonconductive pattern 110b, a third conductive pattern 112b, a third nonconductive pattern 114b and a fourth conductive pattern 116b. A word line 136 may also function as a gate electrode of the MTJ transistor.

Figure 14:
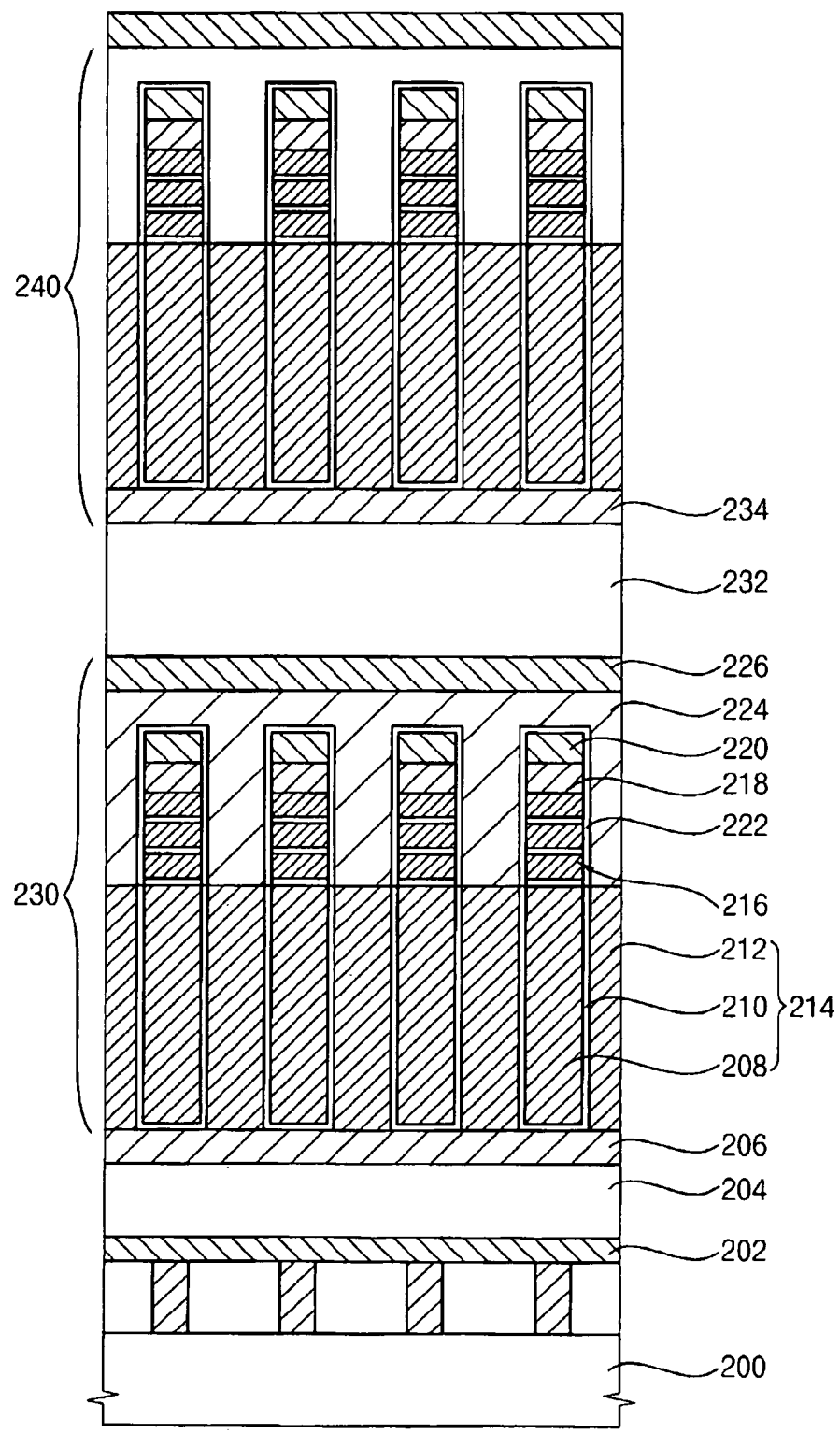
FIG. 14 is a cross sectional view illustrating a DRAM device according to an example embodiment of the present invention.

FIG. 14 is a cross sectional view illustrating a DRAM device according to an example embodiment of the present invention. The DRAM device illustrated in the FIG. 14 may have the same unit cell structure as described with respect to an example embodiment of the present invention as shown in FIG. 4, except the unit cells are vertically stacked as a multilayer structure.

According to an example embodiment of the present invention as shown in FIG. 14, a plurality of underlying structures may be formed on a substrate 200. Underlying structures may include transistors (not shown) and/or wirings 202 for an electronic circuit in a peripheral region of the substrate 200.

According to an example embodiment of the present invention, a first insulation interlayer 204 may be formed on a substrate 200, and a top surface thereof may be planarized by a planarization process, for example, a CMP process. Accordingly, underlying structures may be covered with a first insulation interlayer 204. Further, a first polysilicon layer 206 doped with N type impurities may be formed on a first insulation interlayer 204.

A first operation unit 230 having the same structure and shape as described with respect to an example embodiment of the present invention shown in FIG. 4 may be formed on a first polysilicon layer 206.

According to an example embodiment of the present invention, a first operation unit 230 may include a device isolation pattern (not shown) on a first polysilicon layer 206 extending in a second direction. A first capacitor 214 may be formed on a first polysilicon layer 206, and a first MTJ structure 216 may be formed on a first capacitor 214. A first MTJ structure 216 may contact a storage electrode 208 of a first capacitor 214, and may include conductive patterns and nonconductive patterns alternately stacked on each other. A nonconductive pattern may have a band gap higher than that of a conductive pattern. A first bit line 218 may be formed on a first MTJ structure 216 extending in a first direction perpendicular to the second direction. A first hard mask pattern 220 for a bit line may be formed on a first bit line 218 in a first direction. A first capacitor dielectric layer 222 may be formed on top surfaces of a first capacitor 214 and a first hard mask pattern 220 for a bit line and on sidewalls of a first MTJ structure 216 and a first bit line 218. A first word line 224 may be formed on a first capacitor dielectric layer 222 in a second direction. Accordingly, a first word line 224 may be perpendicular to a first bit line 218 and may face sidewalls of a first MTJ structure 216, a first bit line 218 and a first hard mask pattern 220 for a bit line. A second hard mask pattern 226 for the word line may be formed on a first word line 224.

A second insulation interlayer 232 may be formed on a first unit cell 230. A second insulation interlayer 232 may have a thickness sufficient to cover a first operation unit 230, and a top surface thereof may be planarized by a planarization process, for example, a CMP process.

A second polysilicon layer 234 doped with N type impurities may be formed on the first operation unit 230.

A second operation unit 240 having the same structure and shape as described with respect to an example embodiment of the present invention as shown in FIG. 4 may be formed on a second polysilicon layer 234.

According to an example embodiment of the present invention, a DRAM device may include a plurality of unit cells stacked on each other, and thus, may be formed on a small surface area of a substrate.

Figure 15:
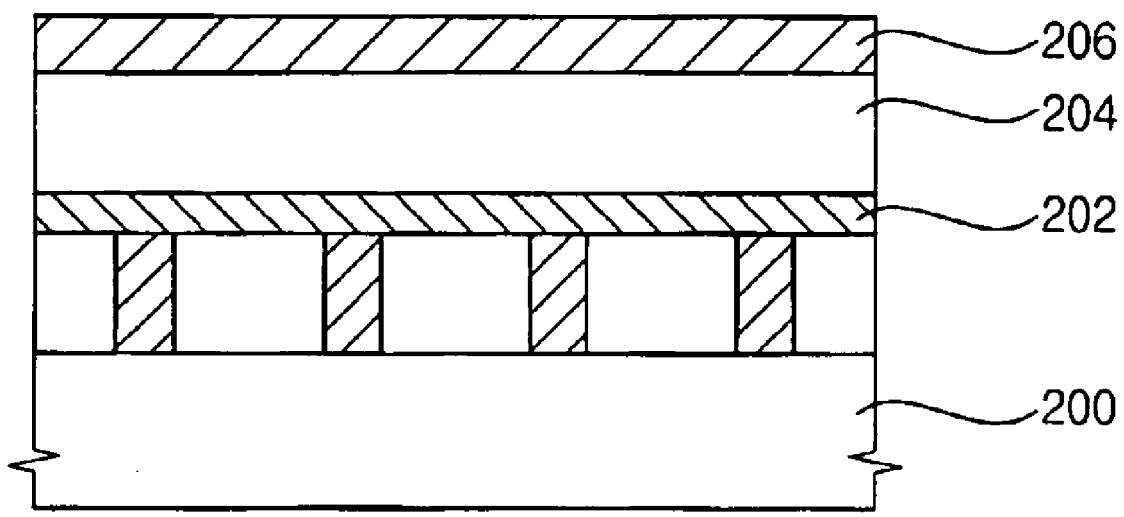
FIG. 15 is a cross sectional view illustrating processing for a method of manufacturing the DRAM device as shown in FIG. 14 in accordance with an example embodiment of the present invention.

FIG. 15 is a cross sectional view illustrating processing for a method of manufacturing a DRAM device shown in FIG. 14.

A DRAM device in accordance with an example embodiment of the present invention may include the same structure as described with respect to FIG. 4 except that the unit cells may be vertically stacked. Accordingly, a DRAM device may be formed using the same process as described with respect to FIGS. 6-13, except an additional process for forming insulation interlayers and polysilicon layers between the unit cells is included according to an example embodiment of the present invention.

According to an example embodiment of the present invention as shown in FIG. 15, a plurality of underlying structures may be formed on a substrate 200, and underlying structures may include transistors (not shown) and/or wirings 202 for an electronic circuit in a peripheral region of the substrate 200.

An insulation material may be deposited onto a substrate 200. An insulation material may have a thickness sufficient to cover underlying structures to thereby form a first insulation layer (not shown) on a substrate 200. A top surface of a first insulation layer may be planarized by a planarization process, for example, a CMP process, to form a first insulation interlayer 204 on a substrate 200. A first polysilicon layer 206 doped with N type impurities may be formed on a first insulation interlayer 204.

According to an example embodiment of the present invention, a first operation unit 230 as described with respect to FIG. 14 may be formed on a first polysilicon layer 206 using the same process as described with respect to FIGS. 6-13.

A second insulation material may be deposited onto a first operation unit 230. The second insulation material may have a thickness sufficient to cover a first operation unit 230 to form a second insulation layer (not shown) on a first operation unit 230. A top surface of a second insulation layer may be planarized by a planarization process, for example a CMP process, thereby forming a second insulation interlayer 232 in FIG. 14.

According to an example embodiment of the present invention, a second polysilicon layer 234 in FIG. 14 doped with N type impurities may be formed on a second insulation interlayer 232.

A second operation unit 240, in accordance with an example embodiment of the present invention as shown in FIG. 14, may be formed on a second polysilicon layer 232 as previously described with reference to FIGS. 6-13.

According to an example embodiment of the present embodiment, a plurality of unit cells may be stacked on each other on a substrate as a multilayer structure without a silicon epitaxial process. Accordingly, a small surface area of a substrate is sufficient for a DRAM device according to an example embodiment of the present invention.

Figure 16:
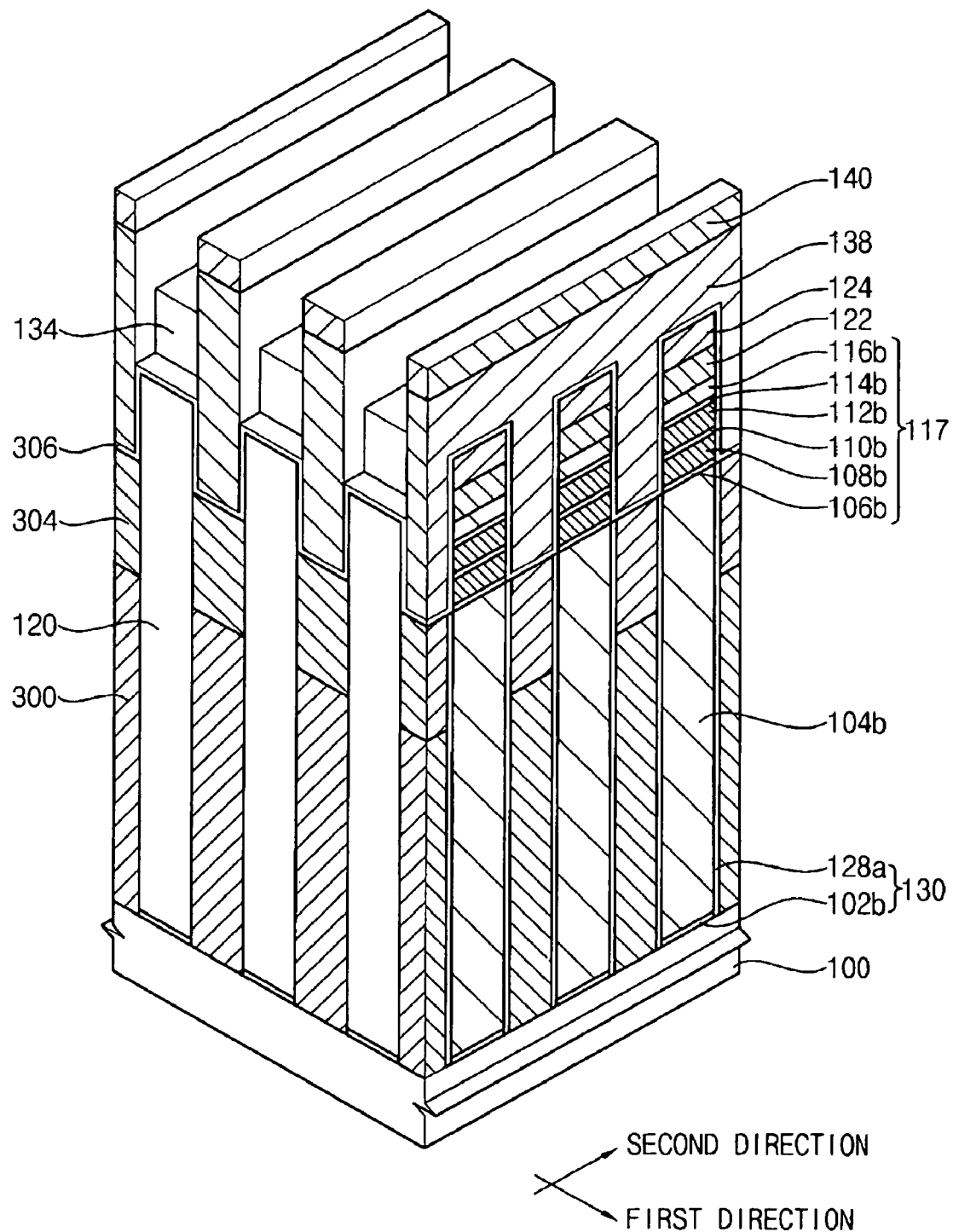
FIG. 16 is a perspective view illustrating a DRAM device according to an example embodiment of the present invention.

FIG. 16 is a perspective view illustrating a DRAM device according to an embodiment of the present invention. The DRAM device may have the same structure as described with respect to an example embodiment of the present invention as shown in FIG. 4, except for a thickness of a gate insulation layer and a thickness of an insulation layer formed on a plate electrode.

According to an example embodiment of the present invention as shown in FIG. 16, a device isolation pattern 120 may be formed on a substrate 100 as a line shape extending in the first direction. A top surface of a device isolation pattern 120 may be coplanar with a top surface of a MTJ structure.

A capacitor may be formed on a top surface of a substrate and may be exposed through the device isolation pattern 120. A capacitor may include a plate electrode 300, a capacitor dielectric layer 130 and a storage electrode 104*b*.

A plate electrode 300 may be formed into a column shape extending vertically from substrate 100. Impurities may be doped into a surface portion of a substrate 100 contacting with a plate electrode 300, thereby forming a boundary conductive layer between a plate electrode 300 and a substrate 100. A capacitor dielectric layer 130 may be formed on sidewalls of a plate electrode 300 and on a substrate 100 between the plate electrodes 300. A storage electrode 104*b* may be formed on a dielectric layer 130 in a space defined by two adjacent column-shaped plate electrodes 300 adjacent. Accordingly, a storage electrode 104*b* may face a plate electrode 300 and a top surface of a storage electrode 104*b* may be higher than that of a plate electrode 300. A storage electrode 104*b* may be enclosed by a capacitor dielectric layer 130. A storage electrode 104*b* may include a conductive material filling a space between the column-shaped plate electrodes 132. The conductive material may include polysilicon doped with first polarity type impurities.

A multiple tunnel junction (MTJ) structure 117 may be formed on a capacitor, for example, on a storage electrode 104*b* of the capacitor. Further, an MTJ structure 117 may include conductive patterns and nonconductive patterns alternately stacked on each other. A nonconductive pattern may have a band gap larger than that of a conductive pattern. An MTJ structure 117 may have the same structure as was described with respect to an example embodiment of the present invention as shown in FIG. 4.

Figure 18:
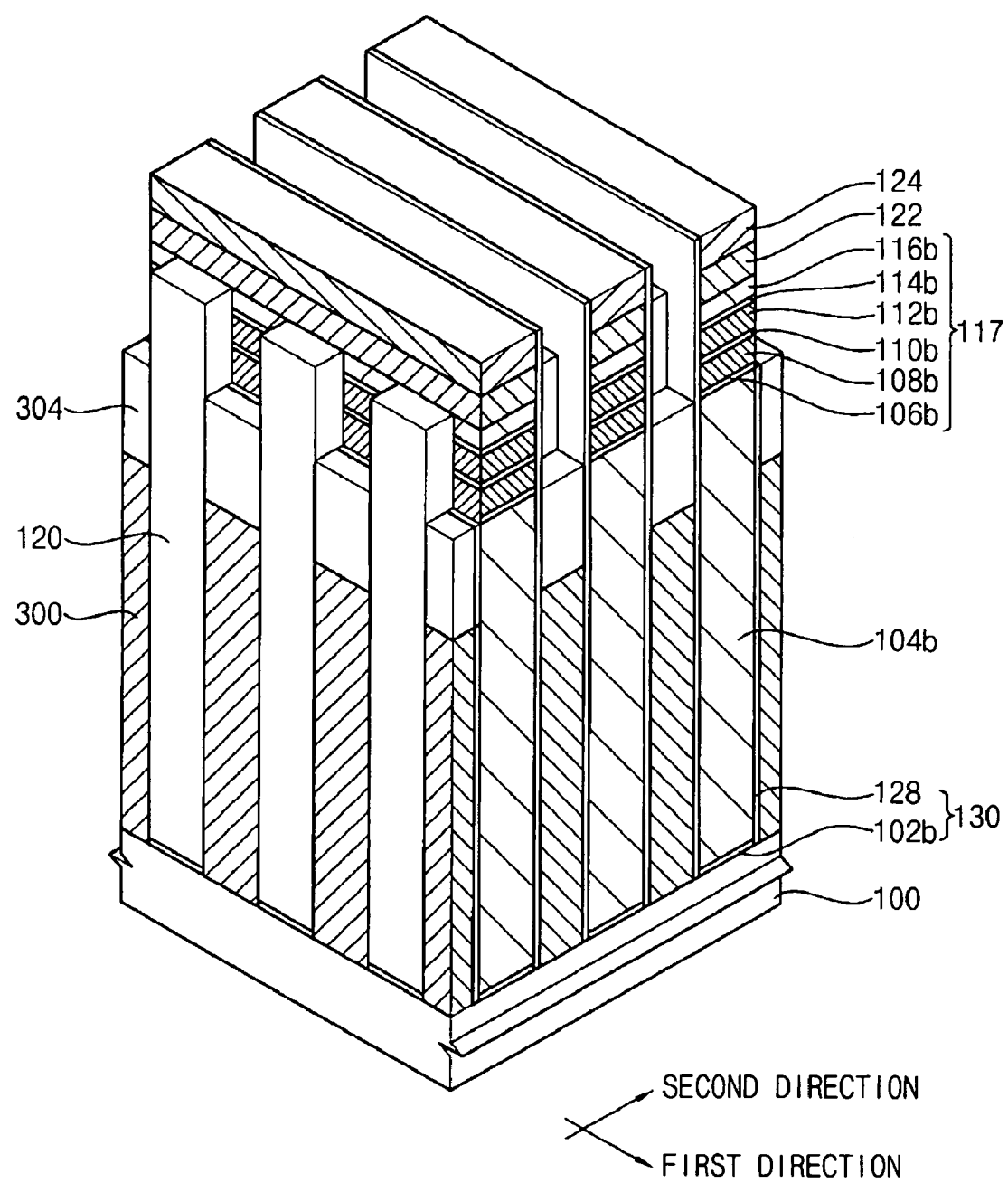

A first insulation layer 304 as shown in FIG. 18 may be formed on a top surface of a capacitor, more particularly, on a top surface of a plate electrode 300. A first insulation layer 304 may have a first thickness such that a top surface of a first insulation layer 304 is lower than a top surface of a first nonconductive pattern 106*b* of an MTJ structure 117. According to an embodiment of the present invention, a top surface of a first insulation layer 304 may be substantially coplanar with a top surface of a storage electrode 104*b*. Accordingly, a top surface of a plate electrode 300 may be lower than a top surface of a storage electrode 104*b* by an amount substantially equal to a thickness of a first insulation layer 304.

A second insulation layer 306 may be formed on a top surface of a first insulation layer 304, on a top surface of a first hard mask pattern 124 and on a sidewall of an MTJ structure 117. A second insulation layer 306 may be formed on a gate insulation layer of an MTJ transistor. A bit line 122 may be formed on an MTJ structure 117 in the second direction perpendicular to the first direction. A first hard mask pattern 124 may be formed on a bit line 122.

A word line 138 may be formed on a second insulation layer 306 in the first direction, and may face an MTJ structure 117. The word line 138 may function as a gate electrode of an MTJ transistor.

According to an example embodiment of the present invention, a unit cell of a DRAM device may further include an insulation interlayer on the top surfaces of a capacitor and a bit line, thereby reducing a parasitic capacitance.

Figure 17:
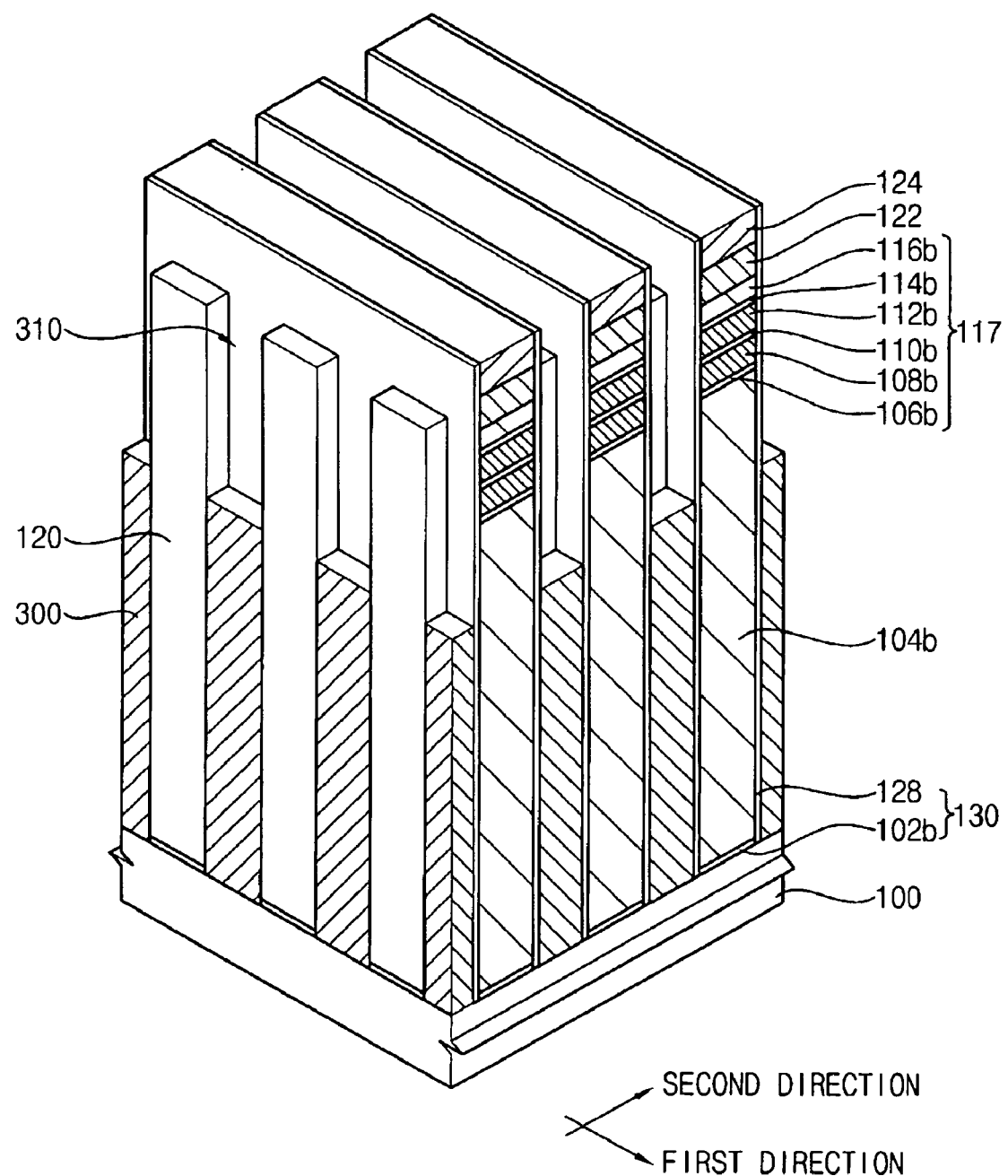
FIGS. 17 to 19 are cross sectional views illustrating a method of manufacturing a DRAM device as shown in FIG. 16 in accordance with an example embodiment of the present invention.
Figure 19:
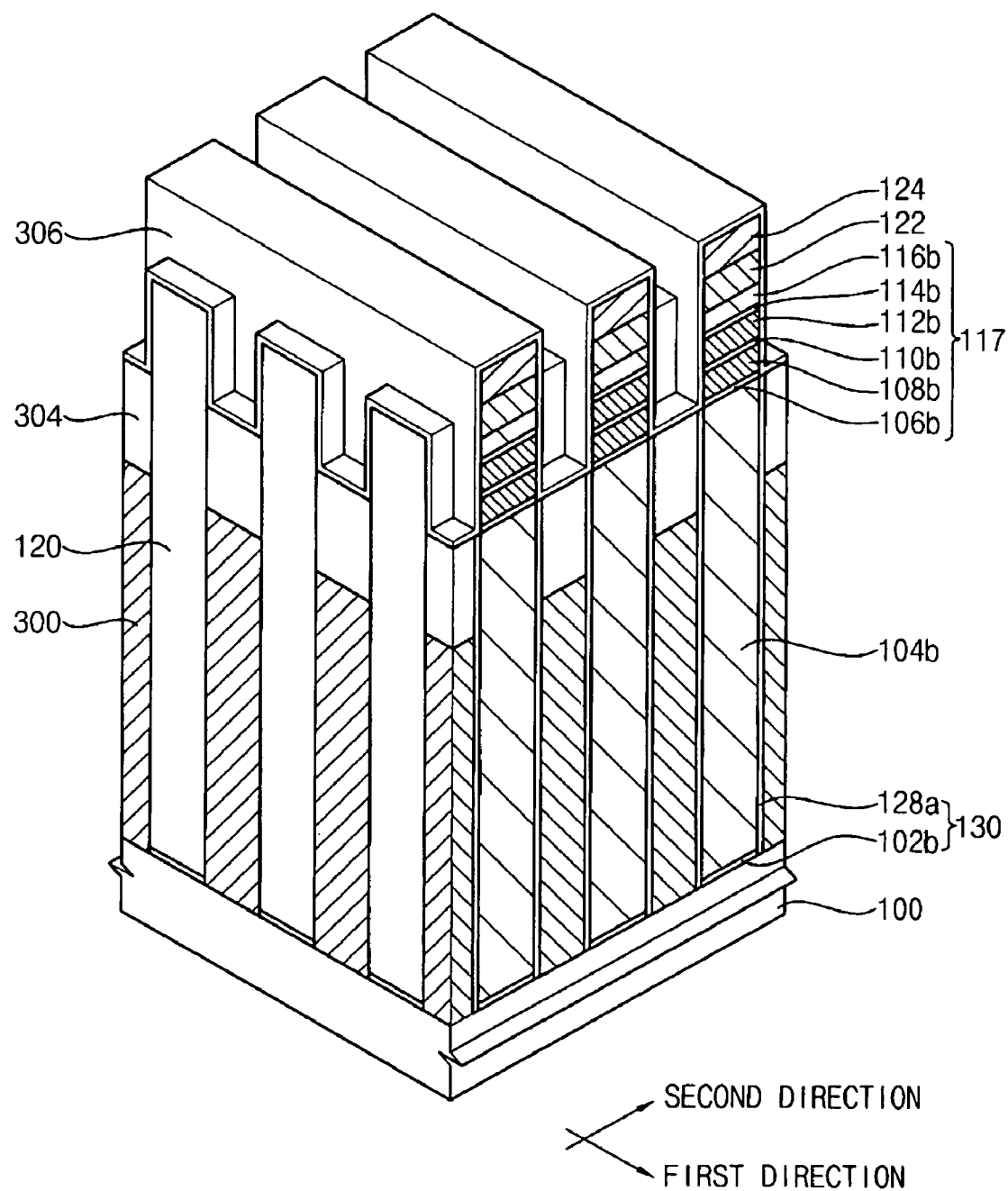

FIGS. 17-19 are cross sectional views illustrating processing according to an example embodiment of a method of manufacturing a DRAM device as shown in FIG. 16

According to an example embodiment of the present invention as shown in FIG. 17, a preliminary second dielectric layer 128 may be formed on a substrate 100 in the accordance with the process as described with reference to FIGS. 4-9.

A sixth conductive layer (not shown) may be formed on a preliminary second dielectric layer 128. A sixth conductive layer may have a thickness sufficient to fill an opening 126 between a bit line 122 and a device isolation pattern 120. A sixth conductive layer may be removed by an anisotropic etching process until a top surface thereof is lower than a top surface of a storage electrode 104b, thereby forming a plate electrode 300 on a preliminary second dielectric layer 128. Accordingly, an entire sidewall of an MTJ structure 117 may be exposed and an upper portion of a storage electrode 104b underlying an MTJ structure 117 may be exposed by an anisotropic etching process. A top surface of a plate electrode 300 may be lower than a top surface of a storage electrode 104b.

A top surface of a plate electrode 300 is much lower than a top surface of a bit line 122 and a device isolation pattern 120. Accordingly, an opening 126 is not filled with a plate electrode 300. That is, an upper portion of an opening 126 remains vacant and is referred to as a residual opening 310 hereinafter.

According to an example embodiment of the present invention, as shown in FIG. 18, a first insulation layer (not shown) may be formed on a first hard mask pattern 124. A first insulation layer may have a thickness sufficient to fill a residual opening 310. A first insulation layer may be planarized by a planarization process, for example, a CMP process until a top surface of a first hard mask pattern 124 is exposed to form a preliminary first insulation pattern (not shown) on a plate electrode 300. A preliminary first insulation pattern and a preliminary second dielectric pattern 128 may be partially etched away by an isotropic and/or an anisotropic etching process until an entire sidewall of an MTJ structure 117 is exposed to form a first insulation pattern 304 on a plate electrode 300.

According to an example embodiment of the present invention, as shown in FIG. 19, a second insulation layer 306 may be formed on an exposed sidewall of an MTJ structure 117, on a top surface of a first isolation pattern 304, on sidewall and top surface of a device isolation pattern 120 and on a top surface of a first hard mask pattern 124. According to an example embodiment of the present invention, a silicon oxide layer may be used as a second insulation layer 306, and a second insulation layer 306 may be formed into a gate insulation layer for an MTJ transistor.

A seventh conductive layer (not shown), e.g., a word line of a DRAM device, may be formed on a second insulation layer 306 as shown in FIG. 16. A second hard mask pattern (not shown) may be formed on a seventh conductive layer in the first direction. A seventh conductive layer may be etched away using a second hard mask pattern as an etching mask to form a word line 138 on a second insulation layer 306.

According to an example embodiment of the present invention, a channel may be vertically created with respect to a substrate and operate as pass transistor in a unit cell of a DRAM device, thereby reducing and/or minimizing influence due to a short channel effect and improving operation characteristics of a DRAM device. Further, a plurality of unit cells of a DRAM device may be vertically stacked on each other on a substrate. Accordingly, a small surface area of a substrate may be sufficient for manufacturing a DRAM device, thereby increasing an integration degree of a DRAM device. Further, an MJT structure 117 as explained with respect to FIGS. 4 and 16 has three conductive layers; however, it is noted that this is not meant to limit the present invention.

Although example embodiments of the present invention have been described herein, it is understood that the present invention should not be limited to these example embodiments but various changes and/or modifications can be made by one or ordinary skill in the art are still within the spirit and scope of the present invention as hereinafter claimed.

What is claimed is:

1. A method of manufacturing a dynamic random access memory (DRAM) device, comprising:
    forming a multiple tunnel junction (MTJ) structure including conductive patterns and nonconductive patterns alternately stacked on each other, the nonconductive patterns having a band gap larger than a band gap of the conductive patterns;
    forming a first insulation layer along a sidewall of the MTJ structure;
    forming a gate electrode on the first insulation layer;
    forming a word line electrically connected with the MTJ structure;
    forming a bit line electrically connected with one of a top surface and a bottom surface of the MTJ structure; and
    forming a capacitor electrically connected with one of a top surface and a bottom surface of the MTJ structure that is not connected with the bit line.

2. The method of claim 1, wherein forming the MTJ structure includes:
    forming a first conductive layer on a substrate, the first conductive layer including polysilicon doped with first polarity type impurities;
    alternately forming at least one nonconductive layer and at least one conductive layer on the first conductive layer until an $n^{th}$ conductive layer is formed as a top portion of the MTJ structure, wherein n is an integer less than 4 and n conductive layers are sequentially formed on the substrate and (n−1) nonconductive layers are sequentially interposed between adjacent conductive layers, and a first and the $n^{th}$ conductive layer include polysilicon doped with first polarity type impurities, and residual conductive layers except the first and the $n^{th}$ conductive layer include polysilicon doped with second polarity type impurities different from the first polarity type impurities; and
    sequentially and alternately patterning the n conductive layers and the (n−1) nonconductive layers.

3. A method of manufacturing a random dynamic access memory (DRAM) device, comprising:
    forming a preliminary storage electrode on a substrate having a line shape extending in a first direction;

forming a preliminary multiple tunnel junction (MTJ) structure on the preliminary storage electrode, the MTJ structure including conductive layers and nonconductive layers alternately stacked on each other, the nonconductive layers having a band gap larger than a band gap of each conductive layers;

forming a conductive layer on the preliminary MTJ structure;

partially etching the conductive layer, the preliminary MTJ structure and the preliminary storage electrode in a second direction perpendicular to the first direction until a top surface of the substrate is exposed, thereby forming a bit line extending in the second direction and a plurality of MTJ structures and storage electrodes isolated from each other;

forming a first dielectric layer on a sidewall of the storage electrodes;

forming a plate electrode between adjacent storage electrodes so that a sidewall of the plate electrode contacts with the first dielectric layer;

forming an insulation layer on a top surface of the plate electrode, a sidewall of the MTJ structure and a top surface of the bit line; and forming a word line on the insulation layer in the second direction, the word line facing the sidewall of the MTJ structure.

4. The method of claim 3, further comprising:

forming a second dielectric layer on the substrate prior to forming the preliminary storage electrode so a bottom surface of the plate electrode contacts the second dielectric layer and a sidewall of the plate electrode contacts the first dielectric layer.

5. The method of claim 3, wherein forming the preliminary MTJ structure includes:

forming a first conductive layer on the preliminary storage electrode, the first conductive layer comprising polysilicon doped with first polarity type impurities;

alternately forming at least one nonconductive layer and at least one conductive layer on the first conductive layer until an $n^{th}$ conductive layer is formed at a top portion of the MTJ structure, wherein n is an integer less than 4 and n conductive layers are sequentially formed on the substrate and n−1 nonconductive layers are sequentially interposed between adjacent conductive layers, a first and the $n^{th}$ conductive layer include polysilicon doped with first polarity type impurities, and residual conductive layers except the first and the $n^{th}$ conductive layers include polysilicon doped with second polarity type impurities that are different from the first polar type impurities; and sequentially and alternately patterning the n conductive layers and the (n−1) nonconductive layers.

6. The method of claim 3, further comprising forming a first hard mask pattern on the conductive layer.

7. The method of claim 3, further comprising forming a device isolation pattern between the preliminary storage electrode and the preliminary MTJ structure.

8. The method of claim 7, wherein forming the plate electrode includes:

forming a conductive layer on the substrate with a thickness sufficient to fill an opening defined by the device isolation pattern and the storage electrode; and partially removing the conductive layer until a lower portion of the MTJ structure is exposed.

9. The method of claim 3, further comprising forming a second insulation layer on the plate electrode of which top surface is lower than a top surface of the storage electrode prior to forming the insulation layer.

10. The method of claim 9, wherein a top surface of the second insulation layer is coplanar with a top surface of the storage electrode.

11. The method of claim 3, wherein forming the word line includes:

forming a conductive layer on the insulation layer; and partially etching the conductive layer to form a word line in the first direction, so the word line is perpendicular to the bit line and faces the sidewall of the MTJ structure at a lower portion thereof.

* * * * *